United States Patent
Scarbrough et al.

(10) Patent No.: US 12,176,035 B2
(45) Date of Patent: *Dec. 24, 2024

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 410 days.

This patent is subject to a terminal disclaimer.

(21) Appl. No.: 17/583,651

(22) Filed: Jan. 25, 2022

(65) Prior Publication Data
US 2023/0207011 A1    Jun. 29, 2023

Related U.S. Application Data

(60) Provisional application No. 63/293,979, filed on Dec. 27, 2021.

(51) Int. Cl.
*H01L 29/76* (2006.01)
*G11C 16/04* (2006.01)
(Continued)

(52) U.S. Cl.
CPC ...... *G11C 16/0483* (2013.01); *H01L 23/5226* (2013.01); *H01L 23/5283* (2013.01);
(Continued)

(58) Field of Classification Search
CPC ........ H10B 41/10; H10B 41/27; H10B 43/10; H10B 43/27; H10B 43/50; G11C 16/0483; H01L 23/5226; H01L 23/5283
See application file for complete search history.

(56) References Cited

U.S. PATENT DOCUMENTS

2023/0207010 A1*  6/2023  Scarbrough ............ H10B 43/50
                                                              257/314

OTHER PUBLICATIONS

U.S. Appl. No. 17/583,472, filed Jan. 25, 2022, by Scarbrough et al.
(Continued)

*Primary Examiner* — Niki H Nguyen
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAVs that individually extend through the insulative tiers and the conductive tiers into the conductor tier. Individual of the TAVs comprises an upper portion directly above and joined with a lower portion. The individual TAVs in a vertical cross-section comprises at least one external upper jog surface. The individual TAVs comprise at least one external lower jog surface in the conductor tier in the vertical cross-section and that is below the upper jog surface. Other embodiments, including method, are disclosed.

60 Claims, 24 Drawing Sheets

(51) Int. Cl.
  *H01L 23/522* (2006.01)
  *H01L 23/528* (2006.01)
  *H10B 41/10* (2023.01)
  *H10B 41/27* (2023.01)
  *H10B 43/10* (2023.01)
  *H10B 43/27* (2023.01)

(52) U.S. Cl.
  CPC ............ *H10B 41/10* (2023.02); *H10B 41/27* (2023.02); *H10B 43/10* (2023.02); *H10B 43/27* (2023.02)

(56) References Cited

OTHER PUBLICATIONS

U.S. Appl. No. 17/702,160, filed Mar. 23, 2022, by Scarbrough et al.
U.S. Appl. No. 17/727,515, filed Apr. 22, 2022, by Scarbrough et al.

\* cited by examiner

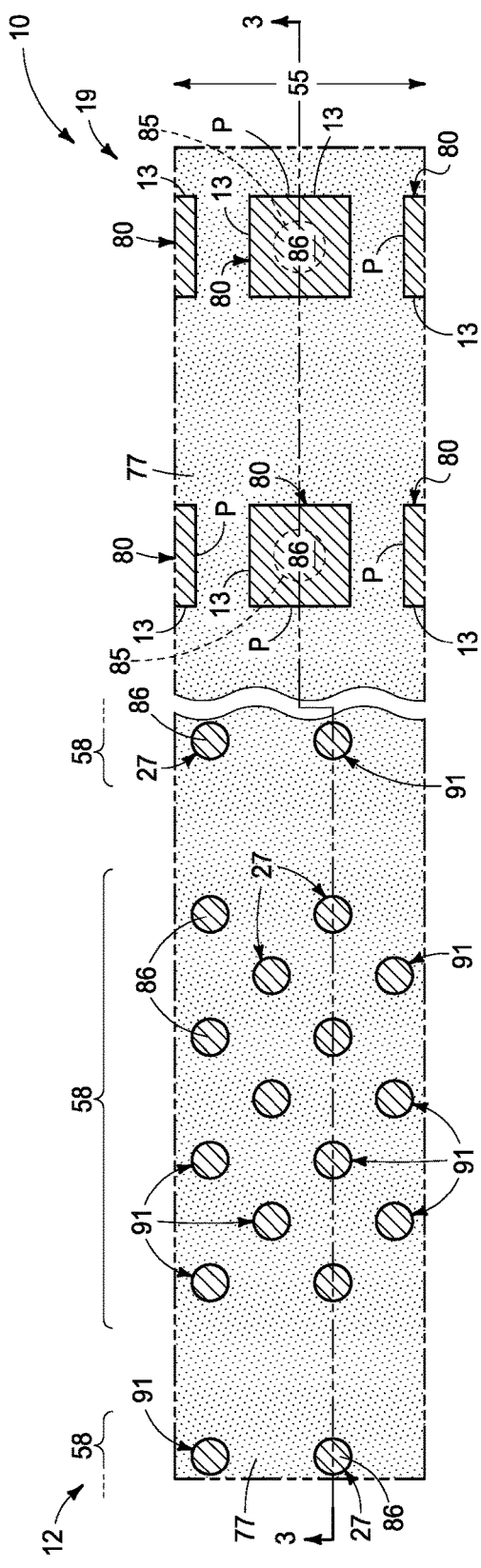
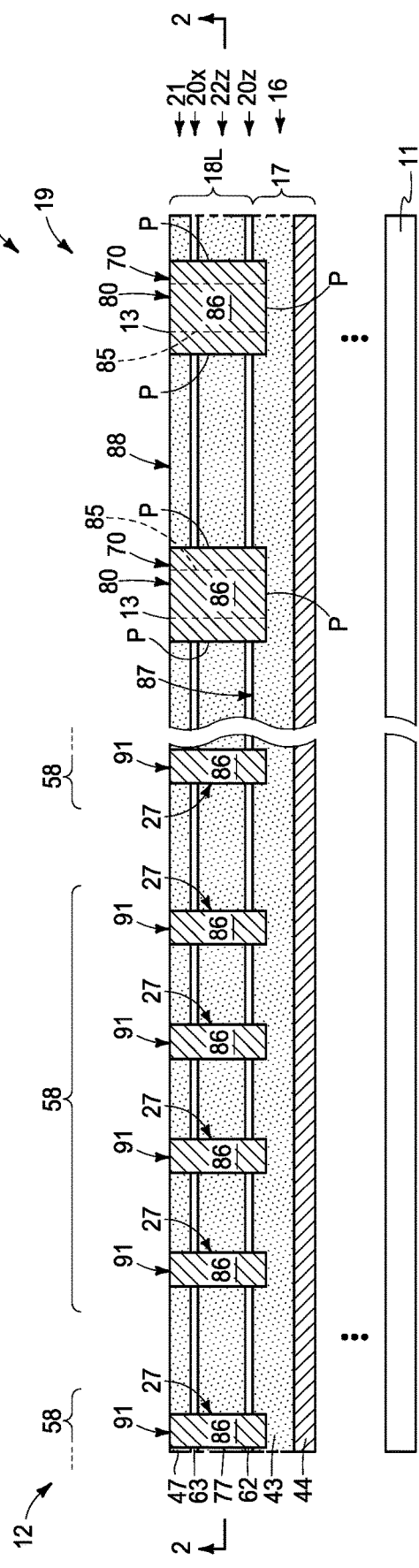
FIG. 2
FIG. 3

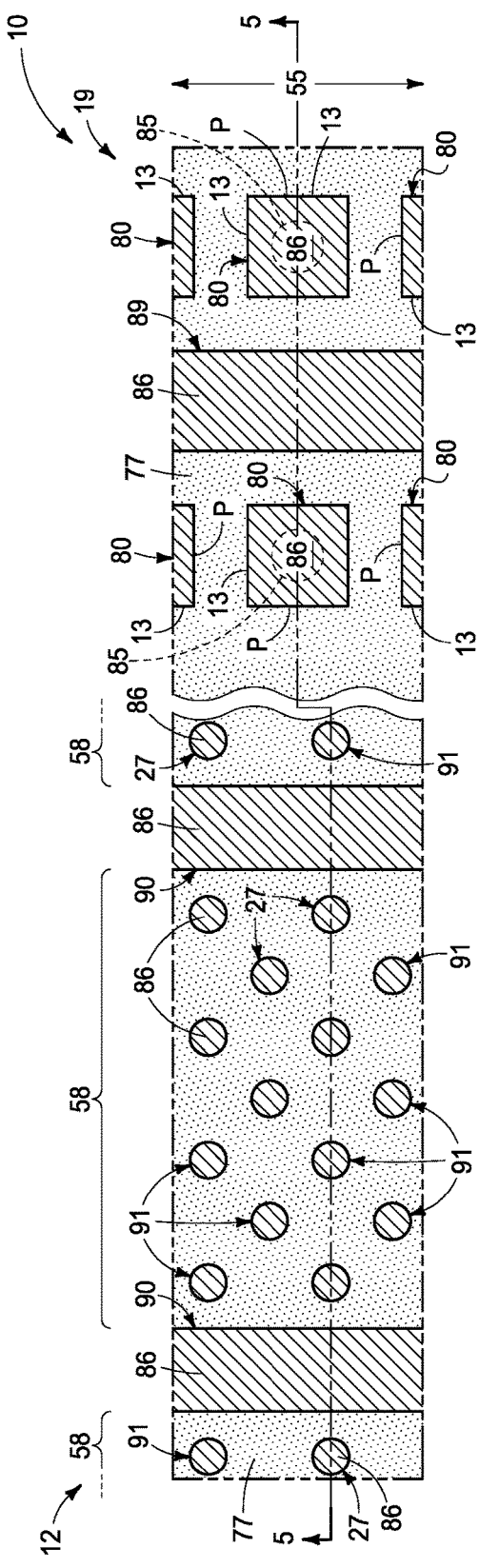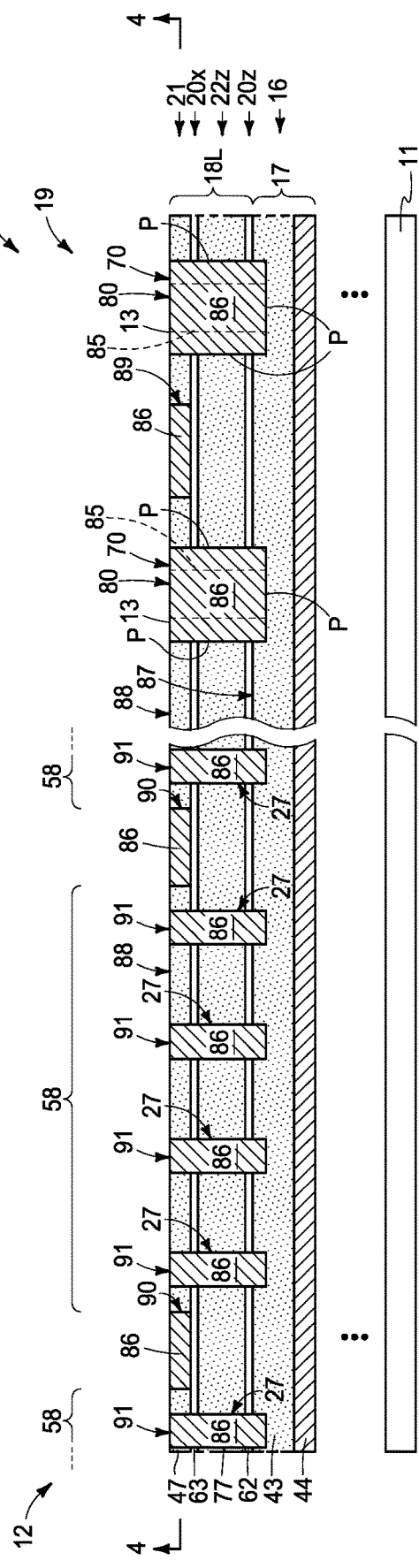

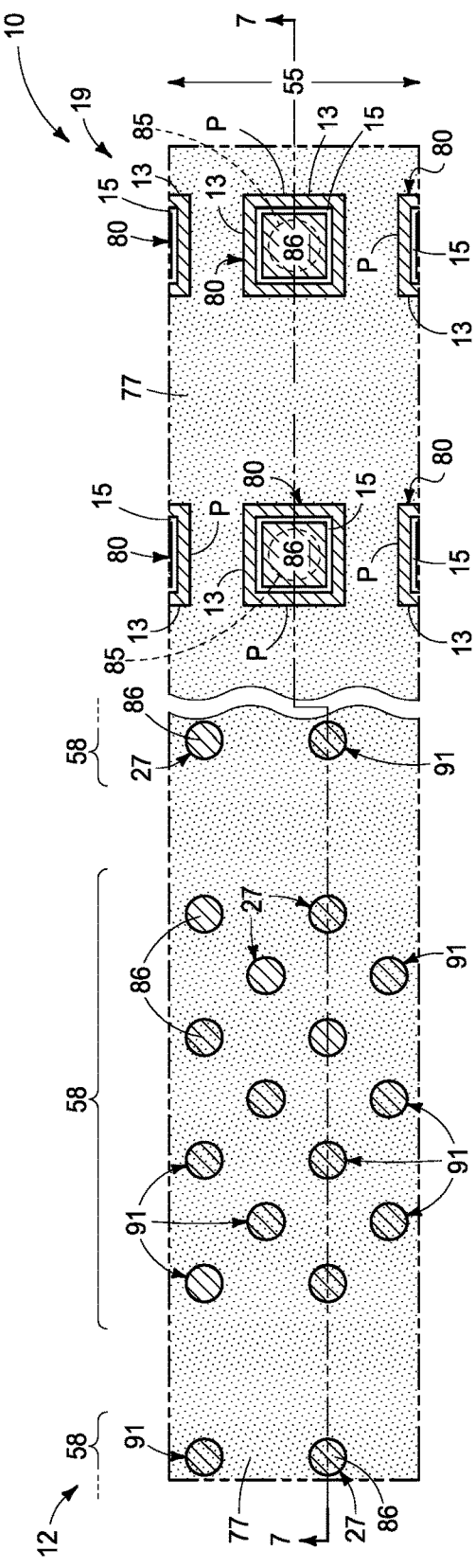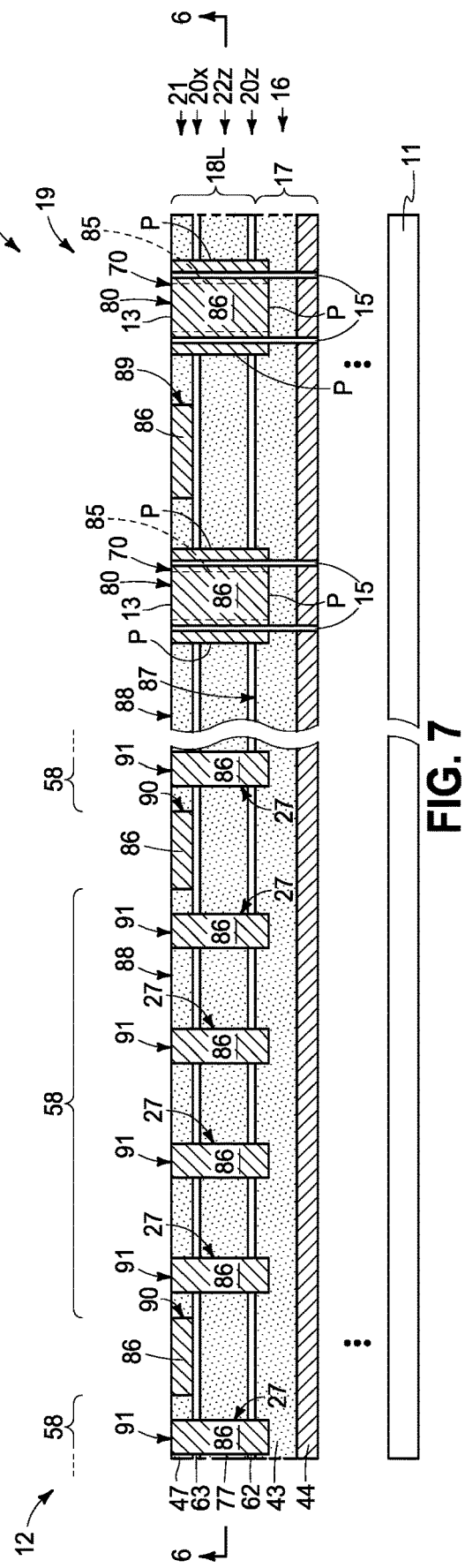

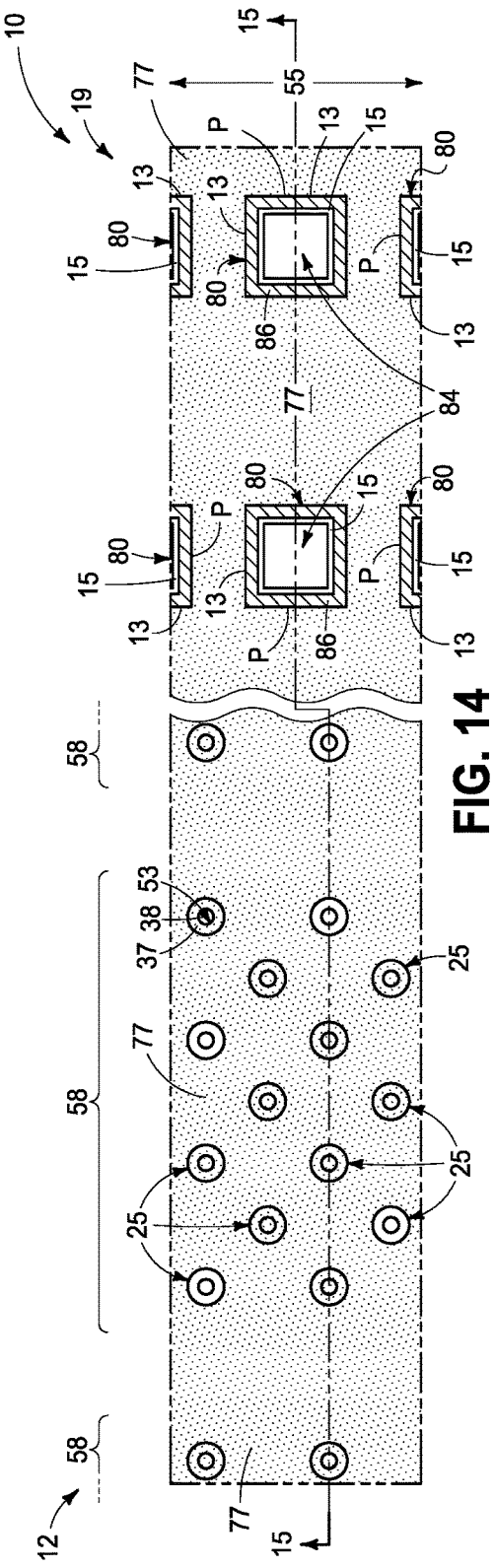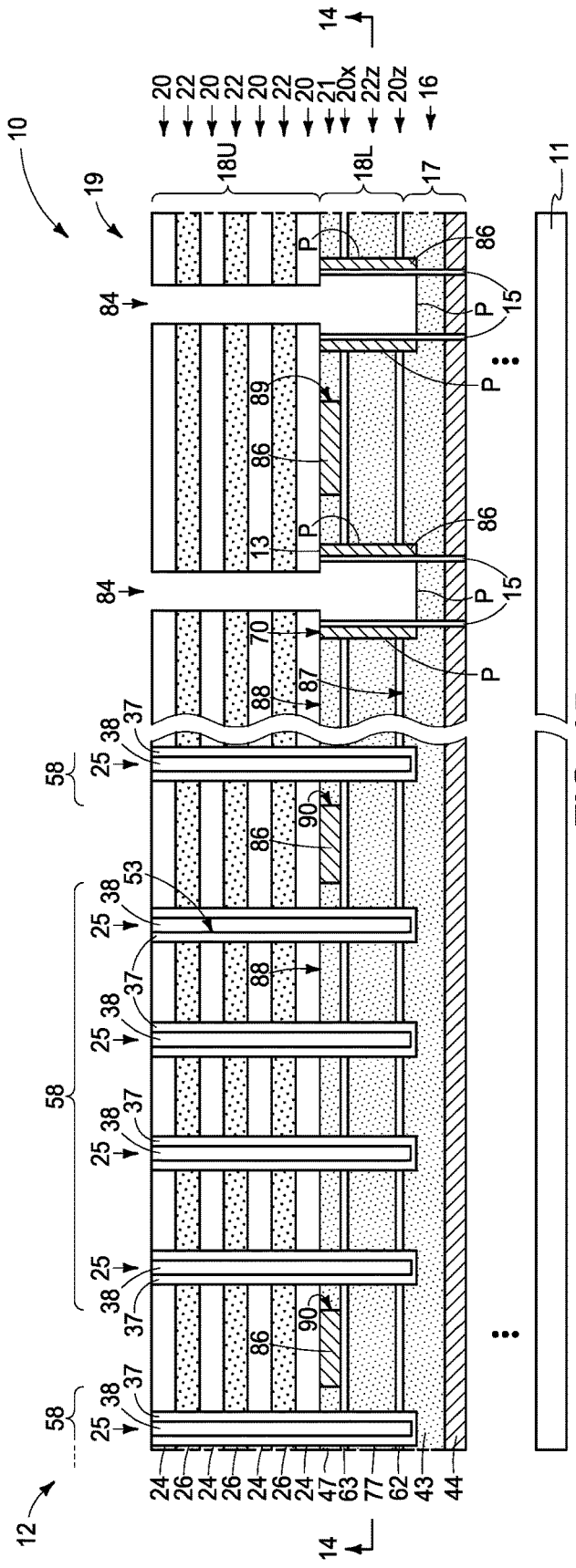

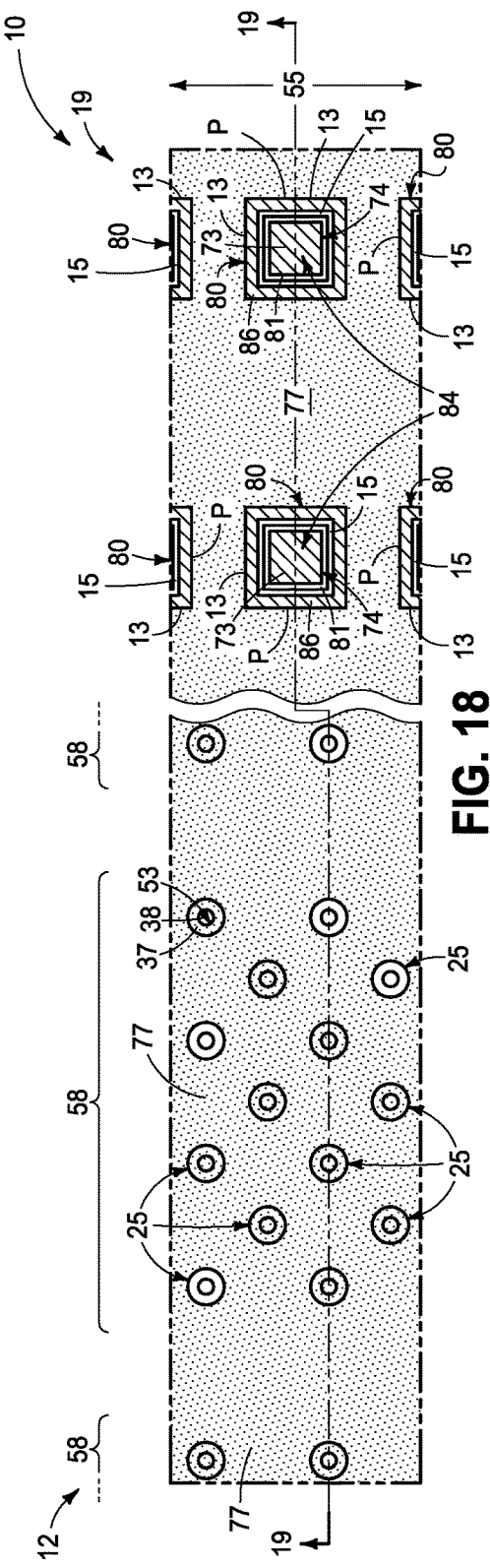
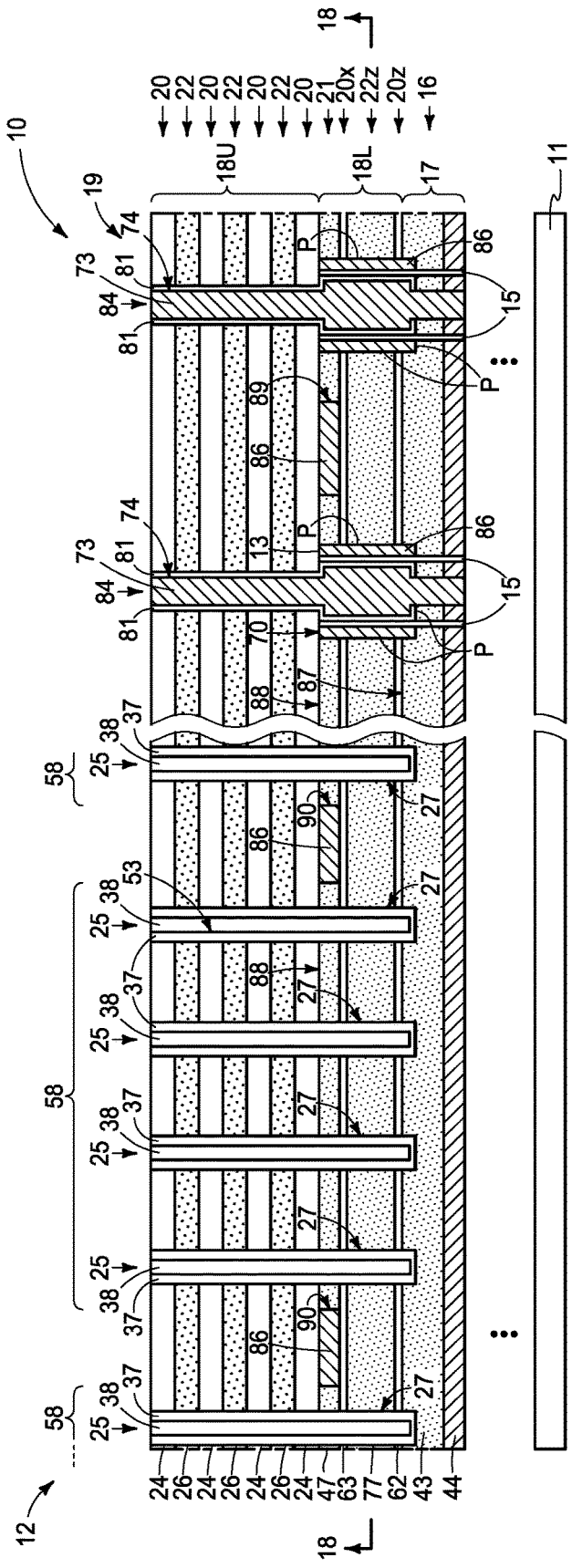

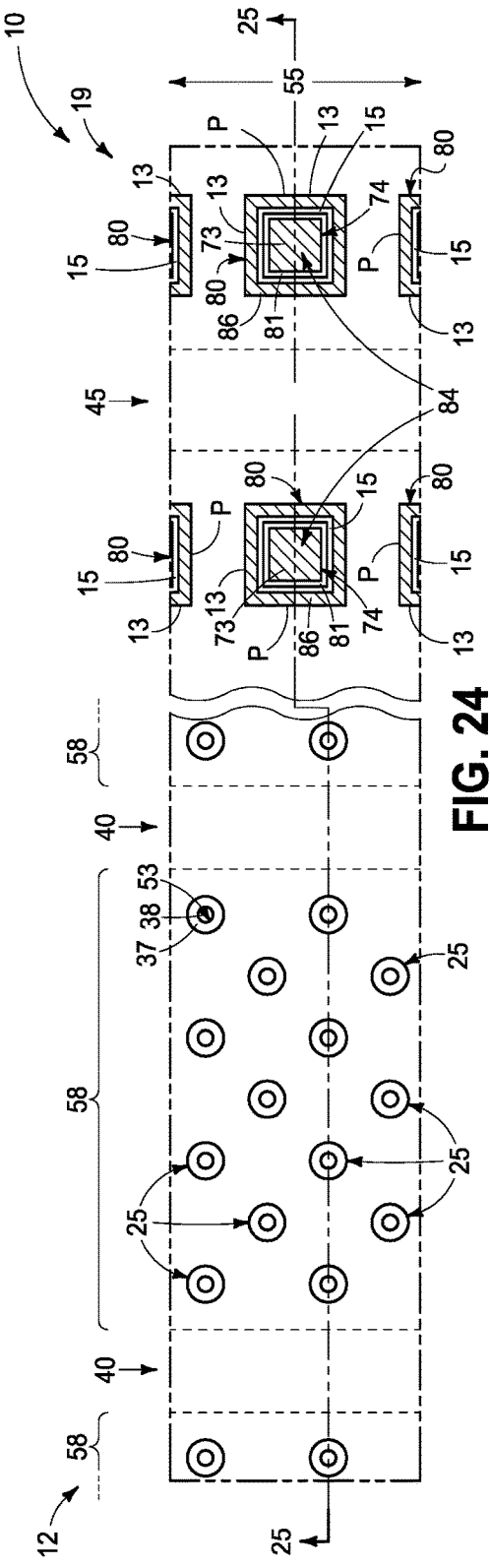
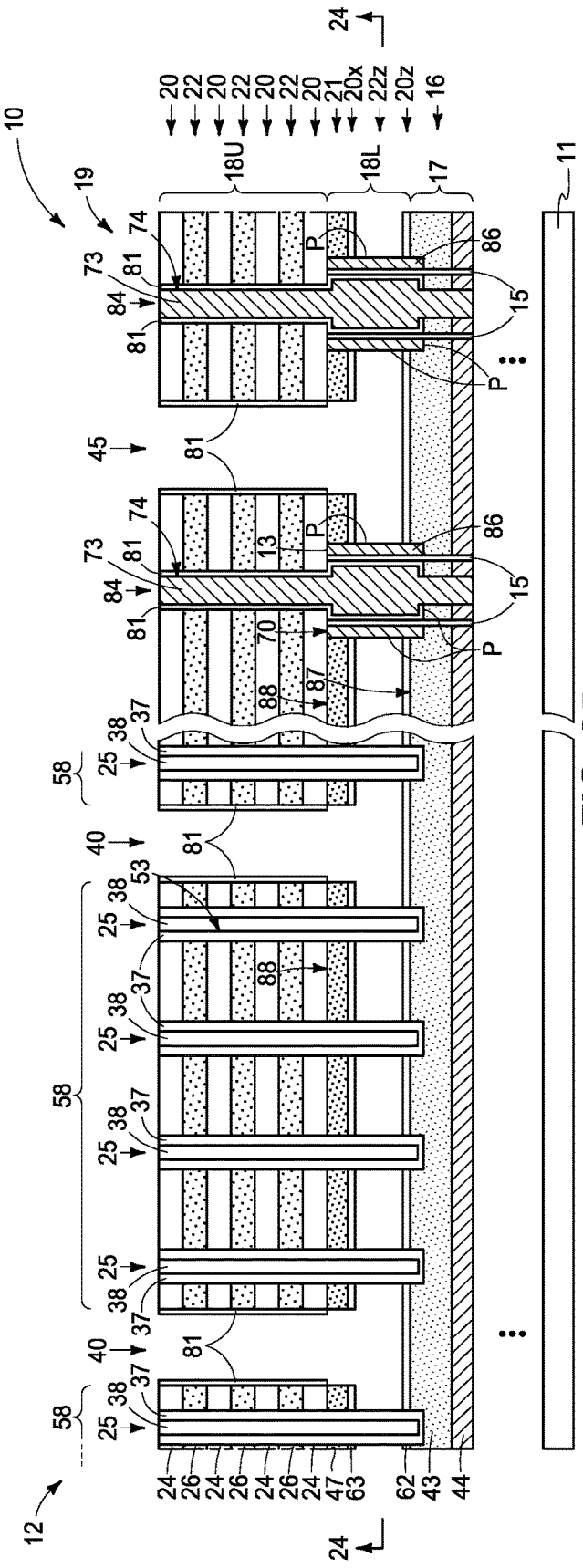
FIG. 24
FIG. 25

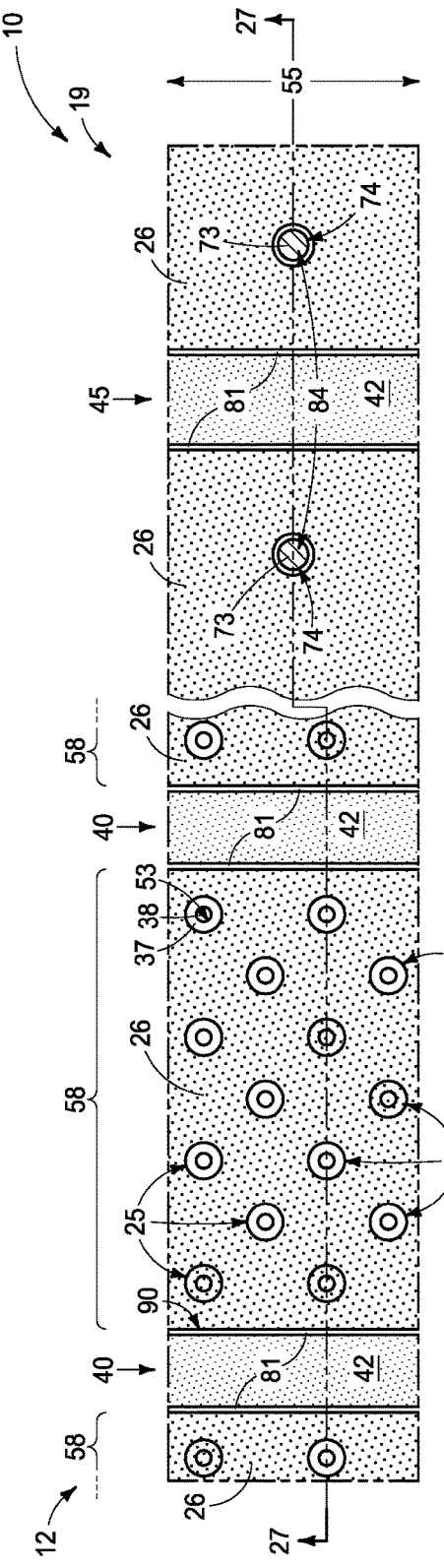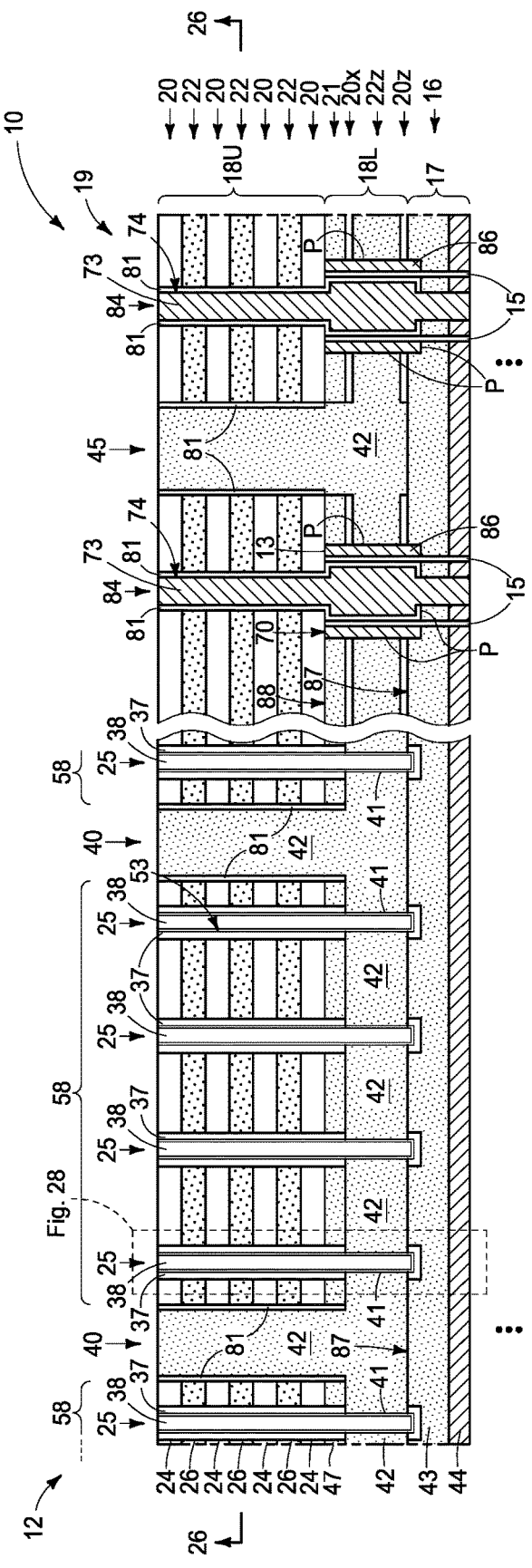

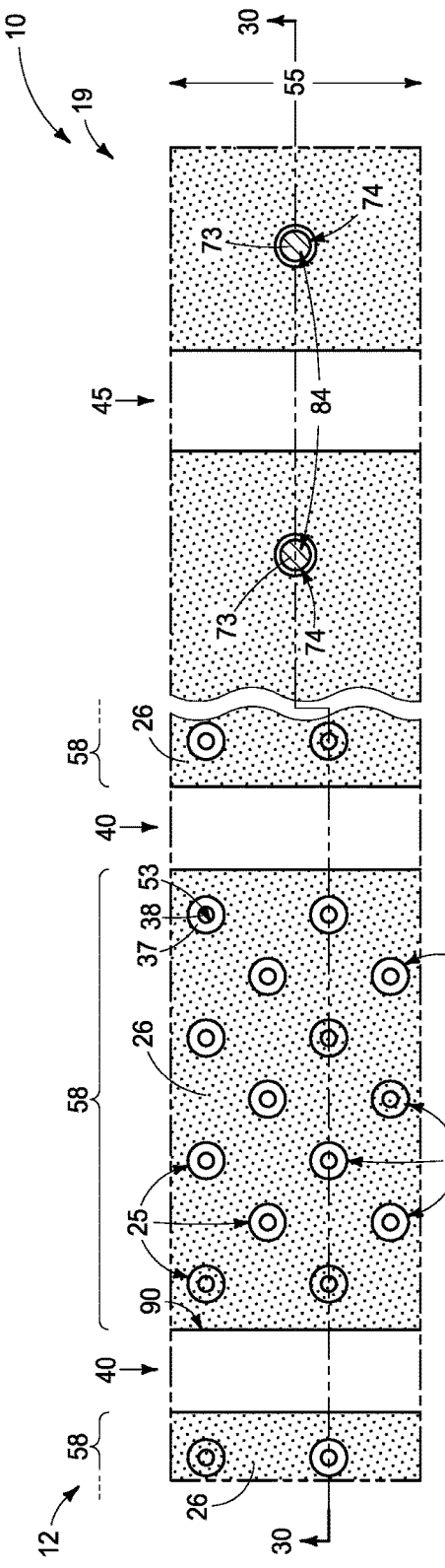
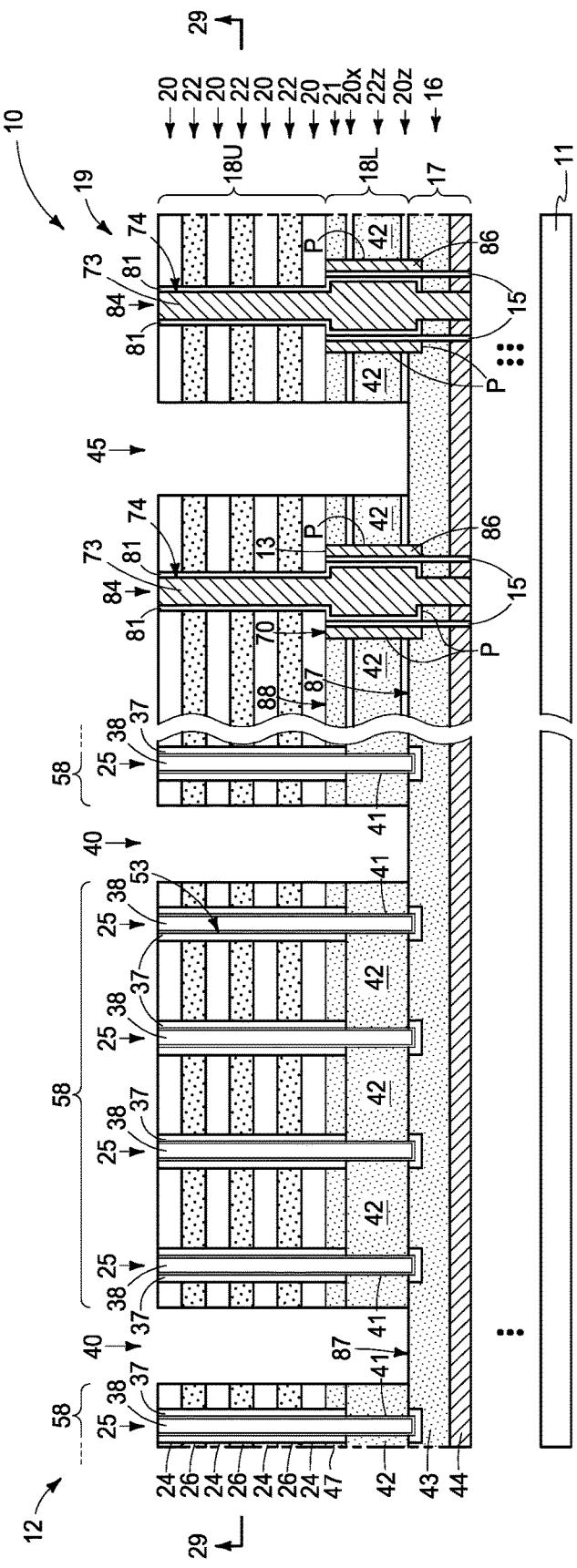
FIG. 29
FIG. 30

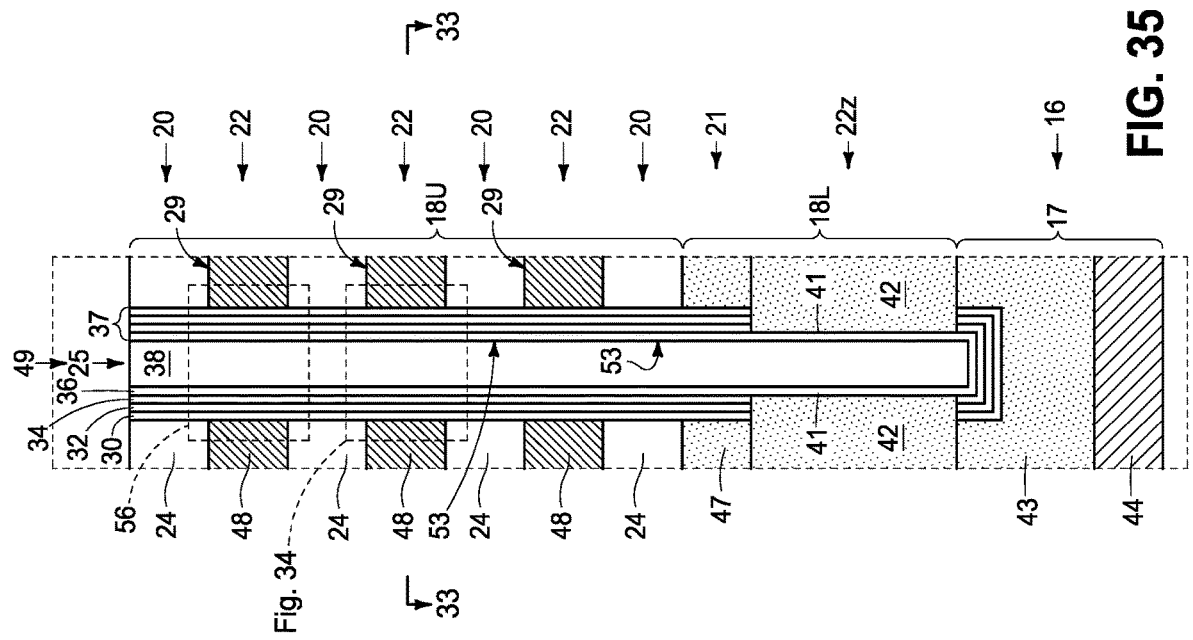
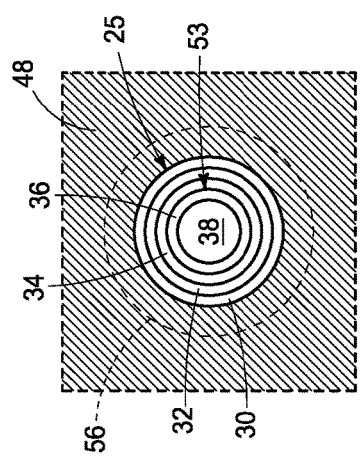
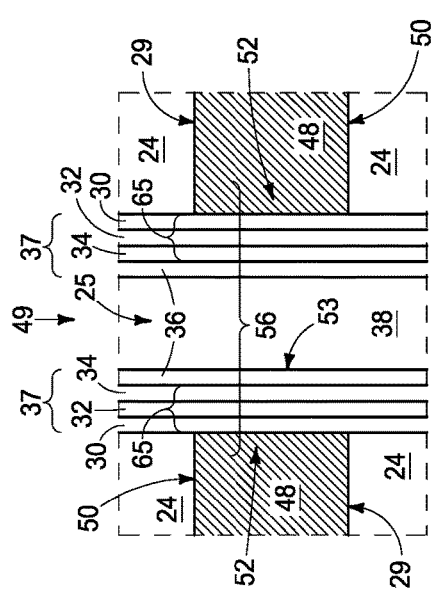

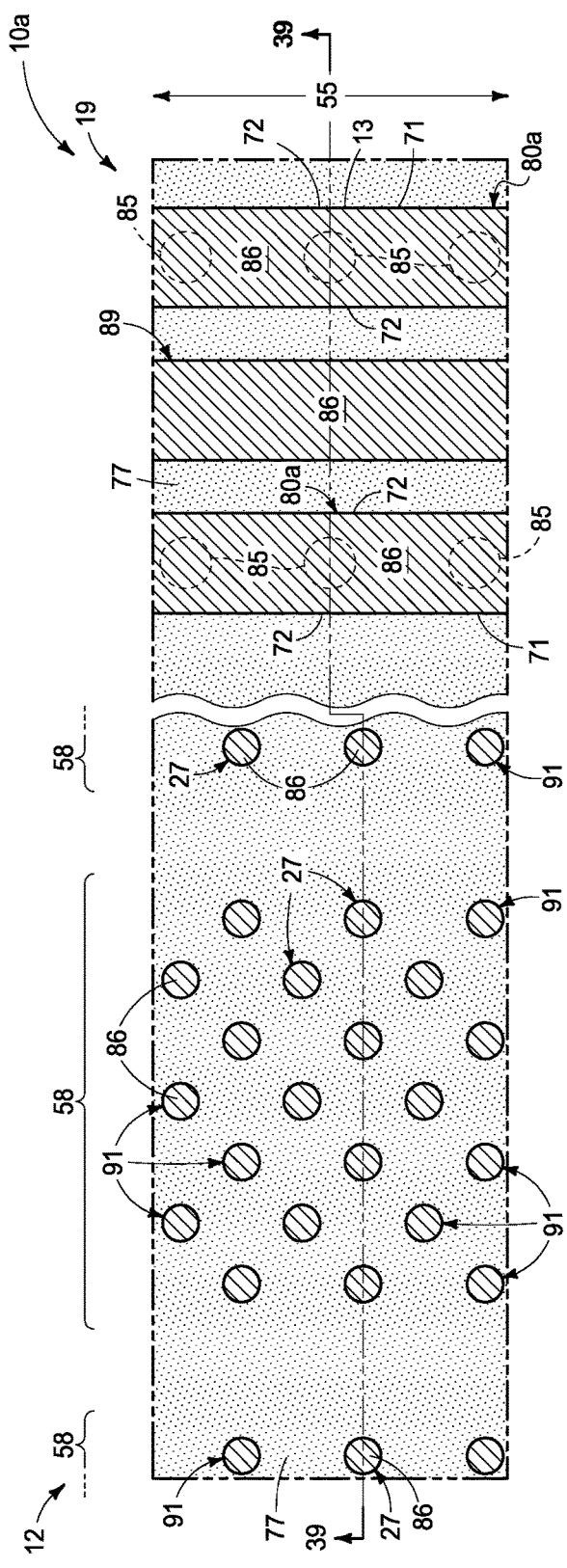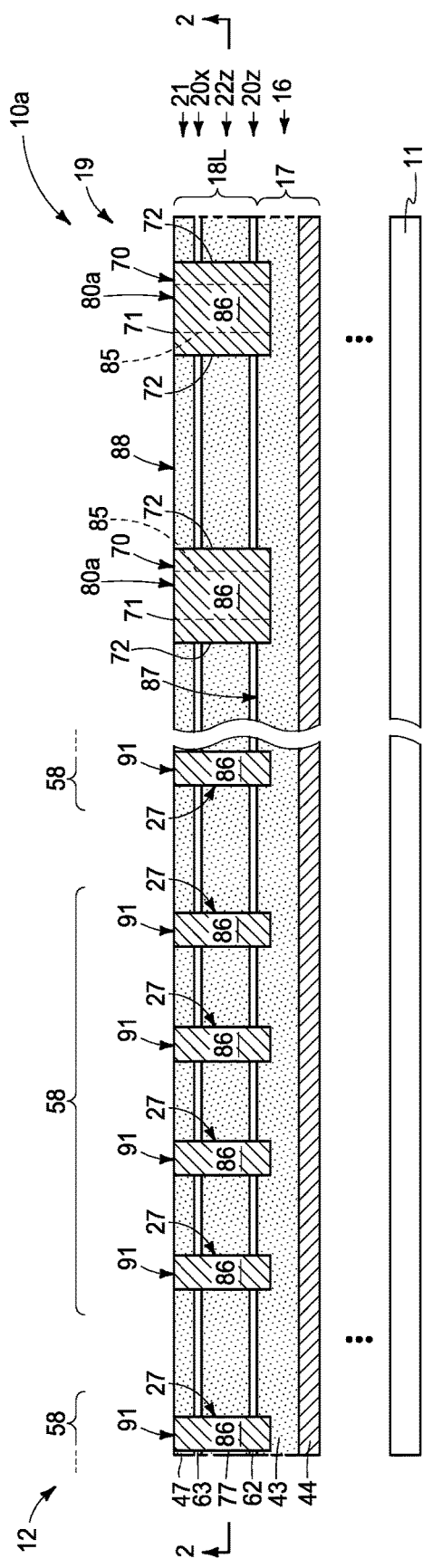

MEMORY ARRAYS COMPRISING STRINGS OF MEMORY CELLS AND METHODS USED IN FORMING A MEMORY ARRAY COMPRISING STRINGS OF MEMORY CELLS

RELATED PATENT DATA

This application claims priority to U.S. Provisional Patent Application Ser. No. 63/293,979, filed Dec. 27, 2021, entitled "Memory Arrays Comprising Strings Of Memory Cells And Methods Used In Forming A Memory Array Comprising Strings Of Memory Cells", naming Alyssa N. Scarbrough and John D. Hopkins as inventors, the disclosure of which is incorporated by reference.

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 2 and 3 are diagrammatic cross-sectional views of portions of a construction (e.g., as part of FIG. 1) that will comprise an array of elevationally extending strings of memory cells in accordance with an embodiment of the invention.

FIGS. 4-45 are diagrammatic sequential sectional and/or enlarged views of the construction of FIGS. 2 and 3, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-45 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

Figure 1:
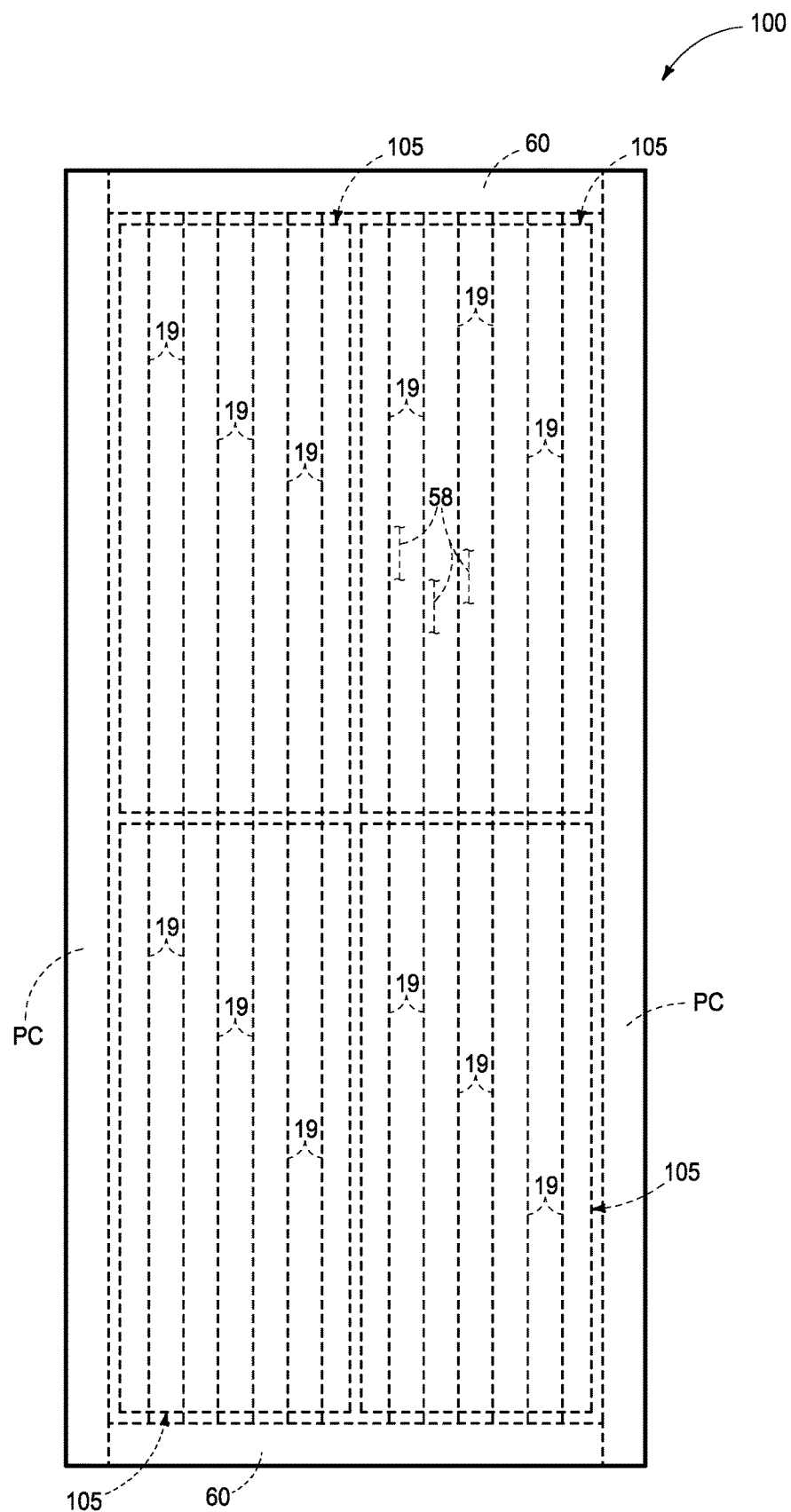
FIG. 1 is a diagrammatic top plan view of a die or die area that may be part of a larger substrate (e.g., a semiconductor wafer, and not shown).

FIG. 1 shows an example diagrammatic embodiment comprising a die or die area 100 that may be part of a larger substrate (e.g., a semiconductor wafer, and not shown) and in which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2 and 3 are diagrammatic larger scale views of portions of die area 100.

Referring to FIGS. 2 and 3, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack and between electronic components at different elevations in a finished construction of integrated circuitry that has been or is being fabricated (e.g., through a stack 18* described below; an * being used as a suffix to be inclusive of all such same-numerically-designated components that may or may not have other suffixes). A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be in a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2 and 3—depicted materials. For example, other partially or wholly fabricated components of integrated circuitry may be provided somewhere above, about, or in base substrate 11. Control and/or other peripheral circuitry for operating components in an array (e.g., array 12 or memory-array region 12) of elevationally-extending strings of memory cells may also be fabricated and may or may not be wholly or partially in an array or sub-array. Further, multiple sub-arrays may also be fabricated and operated independently, in tandem, or otherwise relative one another. In this document, a "sub-array" may also be considered as an array.

In one embodiment, a conductor tier 16 (e.g., having a top 87) comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises conductive metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed in array 12.

A lower portion 18L of a stack 18* has been formed directly above conductor tier 16 (when present) and substrate 11. Stack 18* will comprise vertically-alternating conductive tiers 22* and insulative tiers 20*. Lower portion 18L and conductor tier 16 collectively comprise laterally-spaced memory-block regions 58 that will comprise laterally-spaced memory blocks 58 in a finished circuitry construction and comprise TAV region 19. Memory-block regions 58 and resultant memory blocks 58 (not yet shown) may be considered as being longitudinally elongated and oriented, for example horizontally-parallel relative one another, along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., in array region 12; e.g., comprising material 62, for example silicon dioxide and/or silicon nitride). A next-lowest second tier 20x of second tiers 20* is directly above lowest second tier 20z and may be sacrificial (e.g., in array region 12; e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. Example lower portion 18L comprises a conducting-material tier 21 comprising conducting material 47 (e.g., conductively-doped polysilicon) that is directly above next-lowest second tier 20x. Additional tiers may be present. For example, one or more additional tiers may be above tier 21 (tier 21 thereby not being the uppermost tier in portion 18L, and not shown), between tier 21 and 20x (not shown), and/or below tier 22z (other than 20z not being shown).

Partially-sacrificial plugs 80 comprising material 86 have been formed in lower portion 18L of stack 18* in TAV region 19 and that are individually in horizontal locations 85 where individual TAVs will be formed. Partially-sacrificial plugs 80 comprise islands 13 individually having a perimeter P and having a top 70 that is elevationally-coincident with a top 88 of lower portion 18L. Tops 70 and 88 may or may not be planar. Example perimeter P is shown as being a square although any polygonal or non-polygonal shape may be used (e.g., circular, elliptical, a combination of straight and curved sides, etc.). In one embodiment, material 86 (material 86 referred to as sacrificial material 86 where later removed) comprises insulative material (e.g., silicon dioxide, silicon nitride, aluminum oxide, undoped polysilicon, etc.). In one embodiment, material 86 comprises conductive metal material (e.g., elemental tungsten and/or titanium nitride) and in one such embodiment at least predominantly comprises conductive metal material (more than 50% up to and including 100%). In one embodiment, material 86 comprises semiconductive material (e.g., semi-conductively-doped polysilicon). In one embodiment, islands 13 as initially formed are homogenous.

In one embodiment, sacrifice plugs 91 have been formed in lower portion 18L while (e.g., at the same time as)

forming islands 13. Sacrifice plugs 91 are individually in horizontal locations 27 where channel-material strings will be formed.

Referring to FIGS. 4 and 5, and in some embodiments, sacrificial rails 90 have been formed in lower portion 18L. Sacrificial rails 90 individually are between immediately-laterally-adjacent memory-block regions 58. Such may additionally extend laterally into memory-block regions 58 (not shown). In one embodiment, a sacrificial bar 89 has been formed in lower portion 18L in TAV region 19. More than one sacrificial bar 89 may be formed (not shown) and sacrificial bar(s) 89 may be of the same or different size and/or shape as that/those of sacrificial rails 90. Sacrifice plugs 91, sacrificial rails 90, and sacrifice bar(s) 89, when formed, may be formed at any time relative one another or at one or more same times.

Referring to FIGS. 6 and 7, insulative rings 15 have been formed and individually extend through individual of islands 13, with individual insulative rings 15 being spaced radially-inward from perimeter P of the island 13 through which it extends. Example insulative rings 15 are shown as being a square although any polygonal or non-polygonal shape may be used (e.g., circular, elliptical, a combination of straight and curved sides, etc.). Example materials for insulative rings 15 include silicon dioxide, silicon nitride, aluminum oxide, hafnium oxide, etc.

Referring to FIGS. 8-11, an upper portion 18U of stack 18* has been formed directly above lower portion 18L of stack 18* and islands 13. Example upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown) or tier 21 may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20 and first tiers 22 in upper portion 18U to conductor tier 16 in lower portion 18L (e.g., at least (e.g., at least to lowest first tier 22z in lower portion 18L). Where sacrifice plugs 91 (not shown) are used, channel openings 25 are may be formed by etching materials 24 and 26 to stop on or in the material of sacrifice plugs 91, followed by exhuming remaining material of such plugs through channel openings 25. Channel openings 25 may taper radially-inward (not shown) moving deeper into stack 18 *. In some embodiments, channel openings 25 may go into conductor material 17 of conductor tier 16 as shown or may stop there-atop (not shown). Alternately, as an example, channel openings 25 may stop atop or in the lowest second tier 20z. A reason for extending channel openings 25 at least to conductor material 17 of conductor tier 16 is to provide an anchoring effect to material that is in channel openings 25. Etch-stop material (not shown) may be in or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18*.

Channel material 36 as a channel-material string 53 has also been formed in channel openings 25 elevationally along insulative tiers 20 and conductive tiers 22 in memory-block regions 58 (e.g., after removing sacrifice plugs 91 if such are used). Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown)

may be formed in lower portion 18L in horizontal locations where channel openings 25 will be prior to forming upper portion 18U. Channel openings 25 may then be formed by etching materials 24 and 26 to stop on or in the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Figure 8:
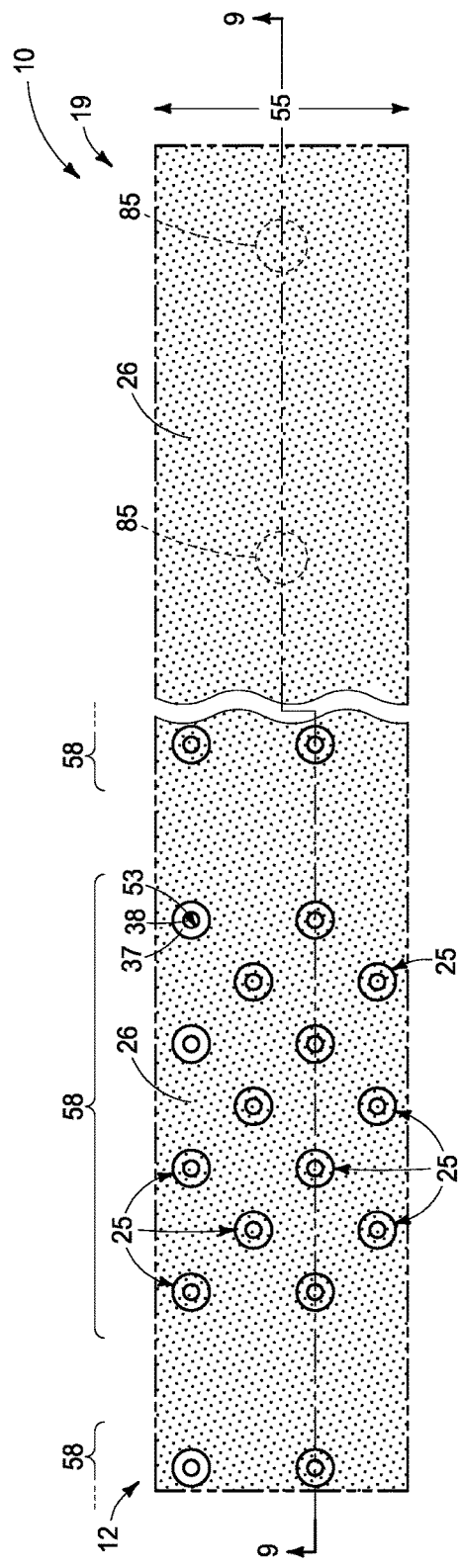
Figure 9:
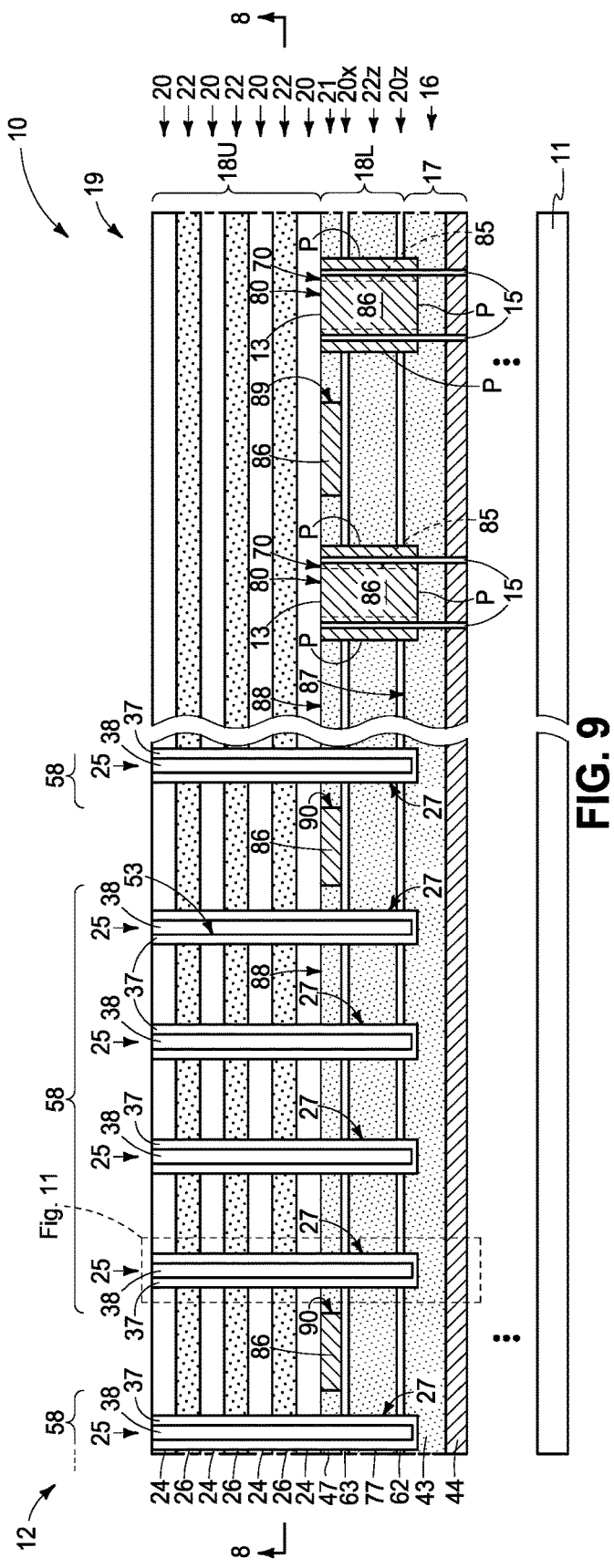
Figure 10:
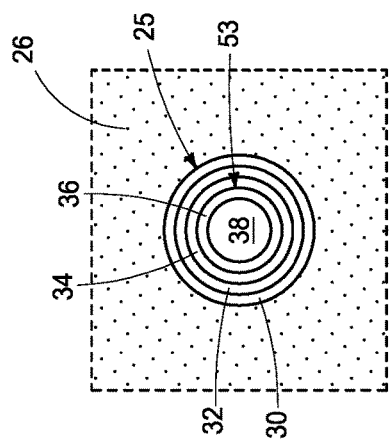
Figure 11:
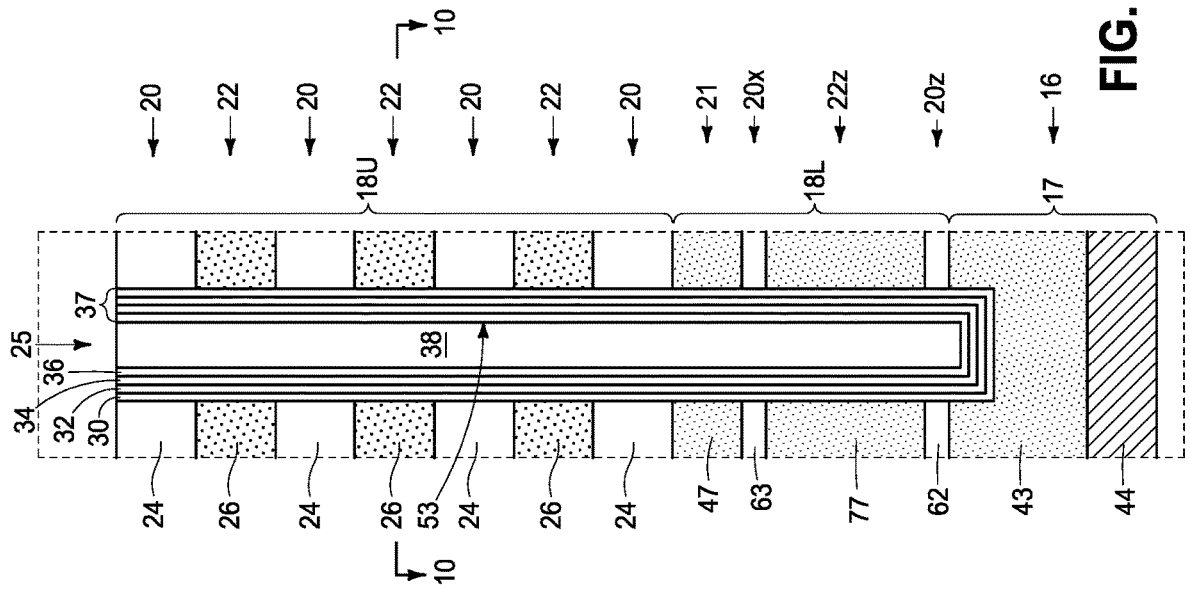
Figure 12:
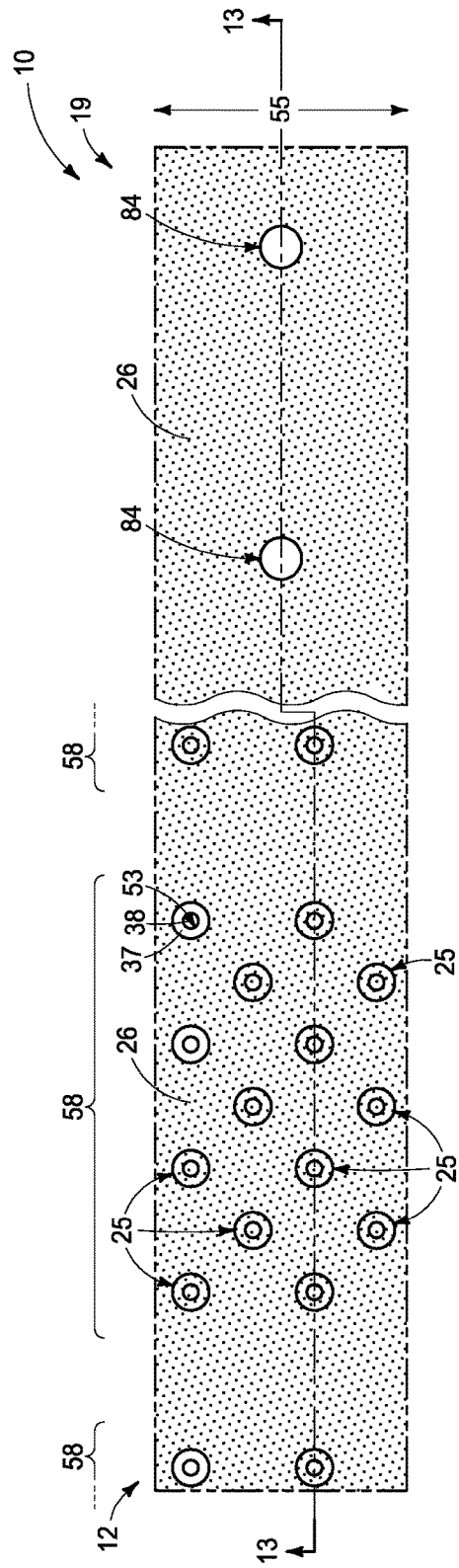
Figure 13:
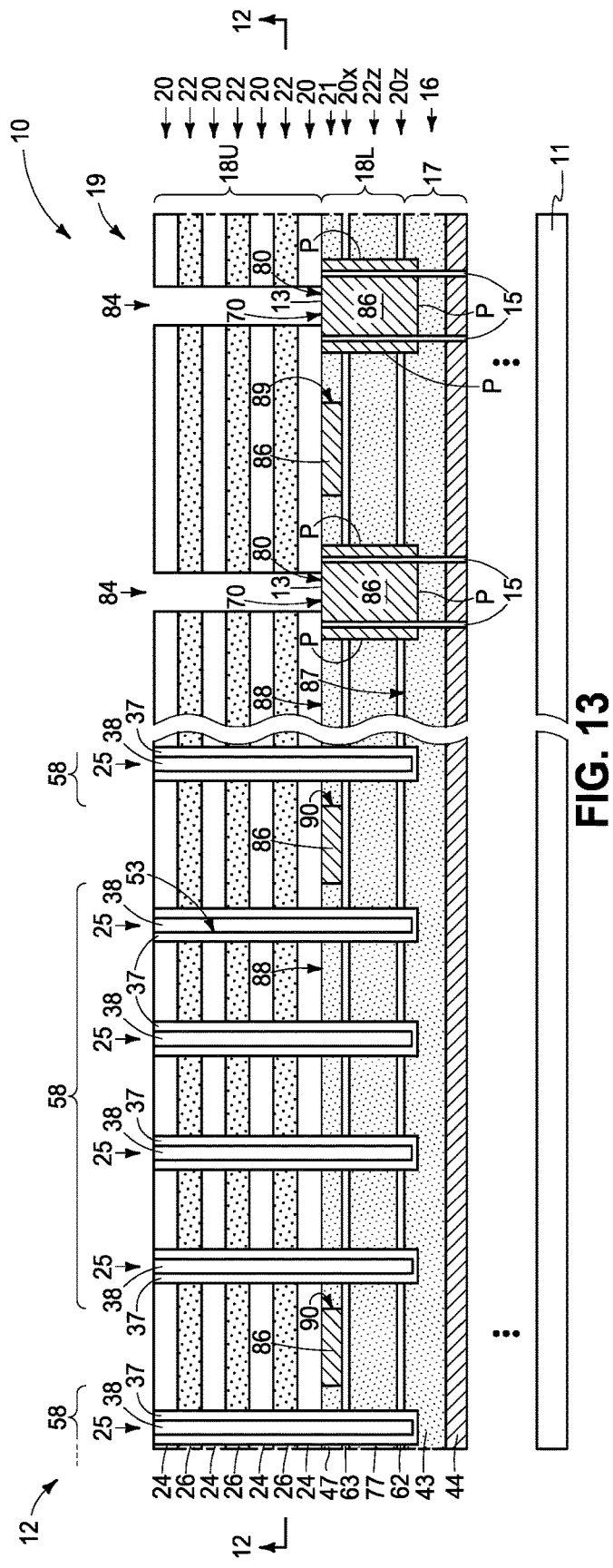

Referring to FIGS. 12 and 13, TAV openings 84 have been formed into upper portion 18L of stack 18* in TAV region 19 that individually are at one of horizontal locations 85 (as shown in FIGS. 8 and 9) and extend to sacrificial material 86 of one of islands 13 that is radially-inward of the insulative ring 15 extending there-through. TAV openings 84 may go into such sacrificial material 86 (not shown). TAV openings 84 may ultimately go to, through, or only into conductor tier 16. TAV openings 84 may taper laterally-inward or laterally-outward moving deeper into stack 18* (not shown).

Referring to FIGS. 14 and 15, sacrificial material 86 of individual islands 13 that is radially-inward of the insulative ring 15 extending there-through has been removed (e.g., by etching) through TAV openings 84 to extend TAV openings 84 deeper into stack 18*.

Figure 16:
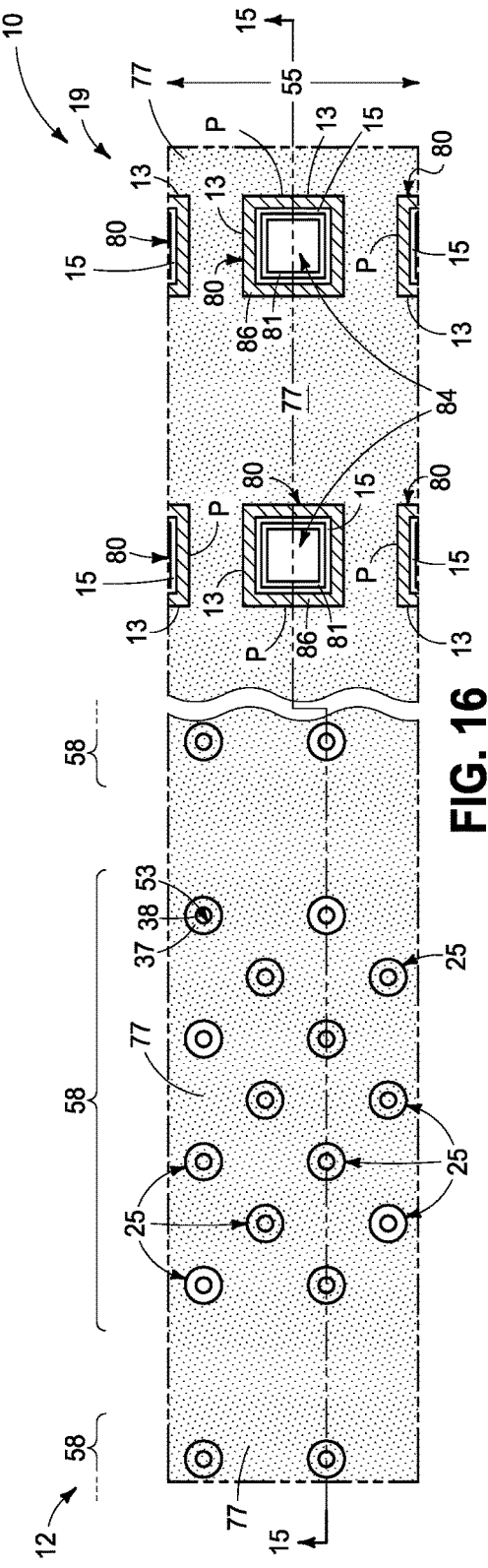
Figure 17:
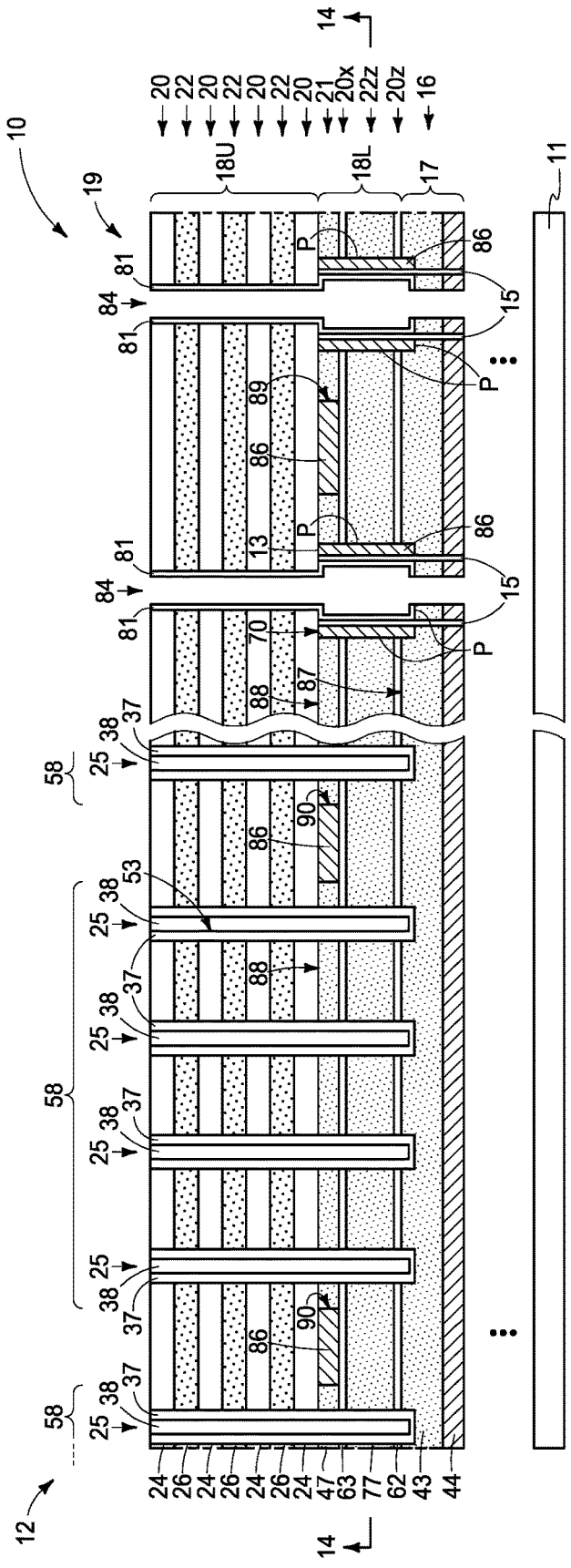

Referring to FIGS. 16 and 17, and in one embodiment, an insulative liner 81 (e.g., hafnium oxide, aluminum oxide, multiple layers of silicon dioxide and silicon nitride, etc.) has been formed inside TAV openings 84, followed by punch-etching there-through to expose material therebelow. In one embodiment and as shown, TAV openings 84 have then been further extended through conductor tier 16 (e.g., by anisotropic etching) to circuitry there-below (not shown).

Referring to FIGS. 18 and 19, conductive material 73 (e.g., a TiN lining having W radially-inward thereof) has been formed to form individual TAVs 74 (e.g., conductive material 73) in individual extended TAV openings 84 and in void-space therein resulting from removing sacrificial material 86.

Figure 20:
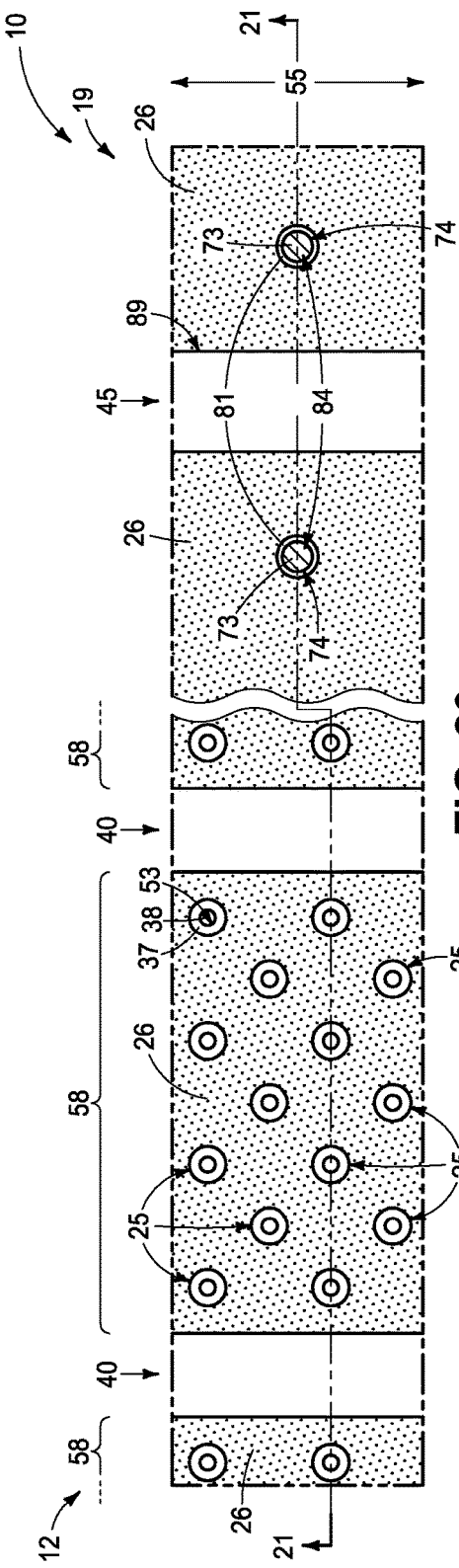
Figure 21:
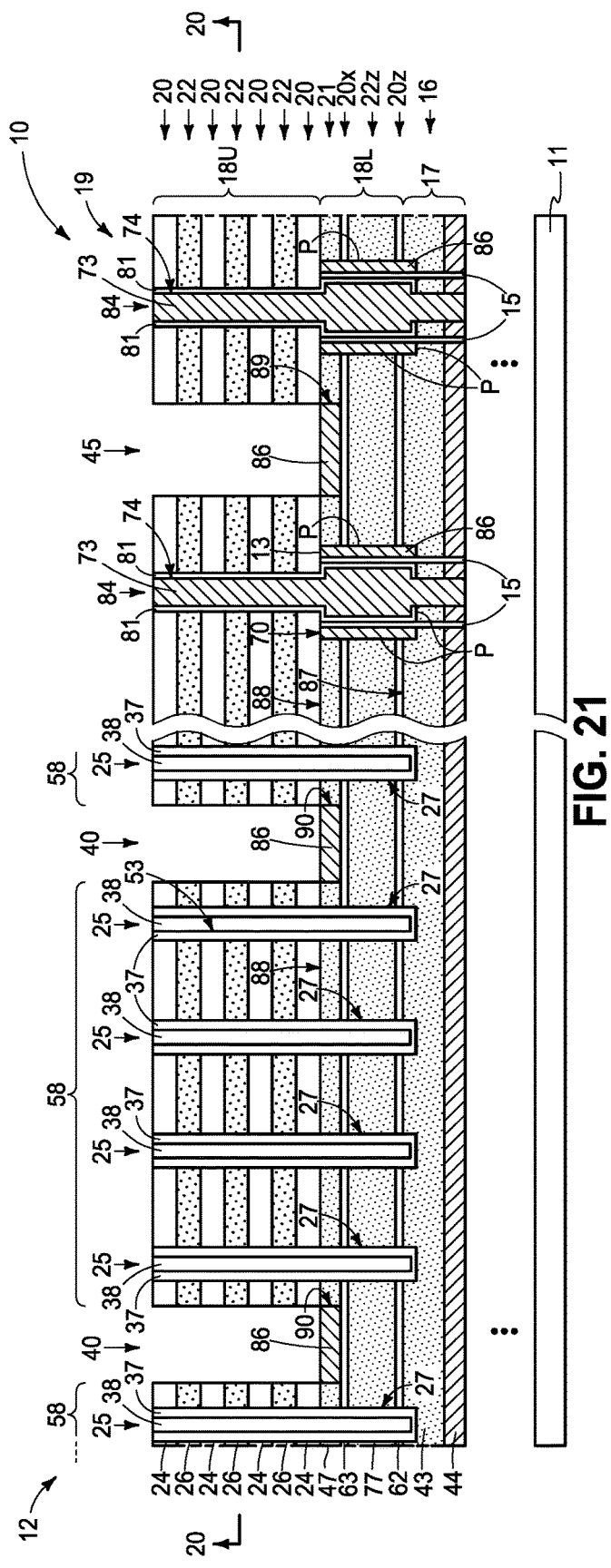

Referring to FIGS. 20 and 21, and in one embodiment, trenches 40 have been formed into upper portion 18U to sacrificial rails 90. In one embodiment, a trench 45 has been formed into upper portion 18U to sacrificial bar 89.

Figure 22:
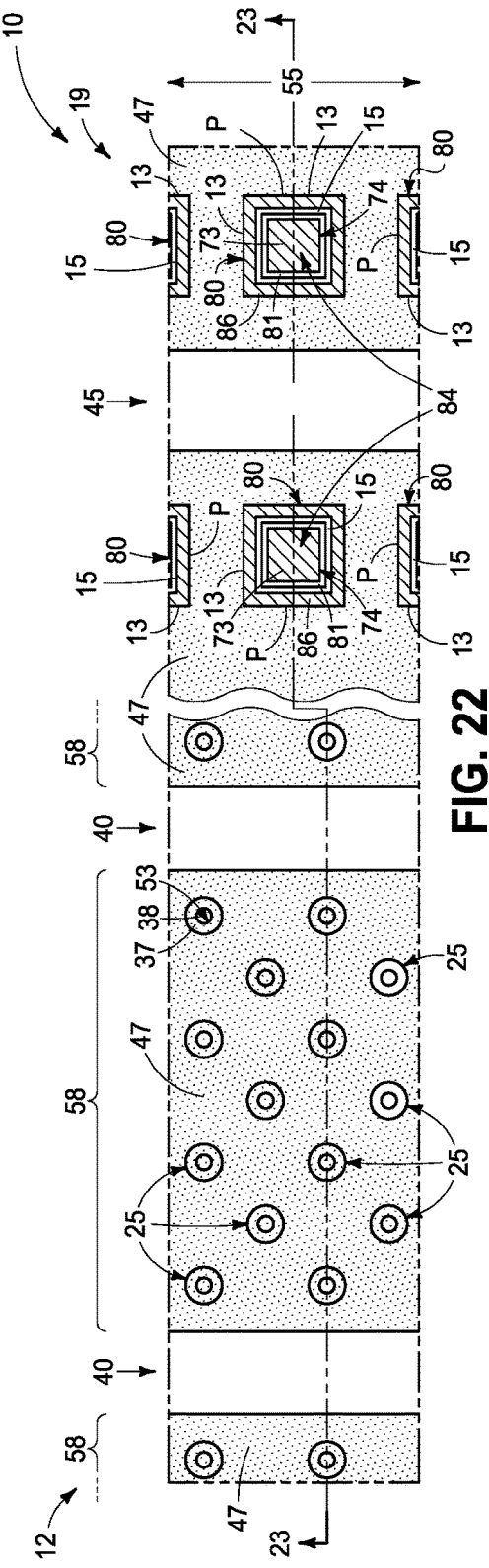
Figure 23:
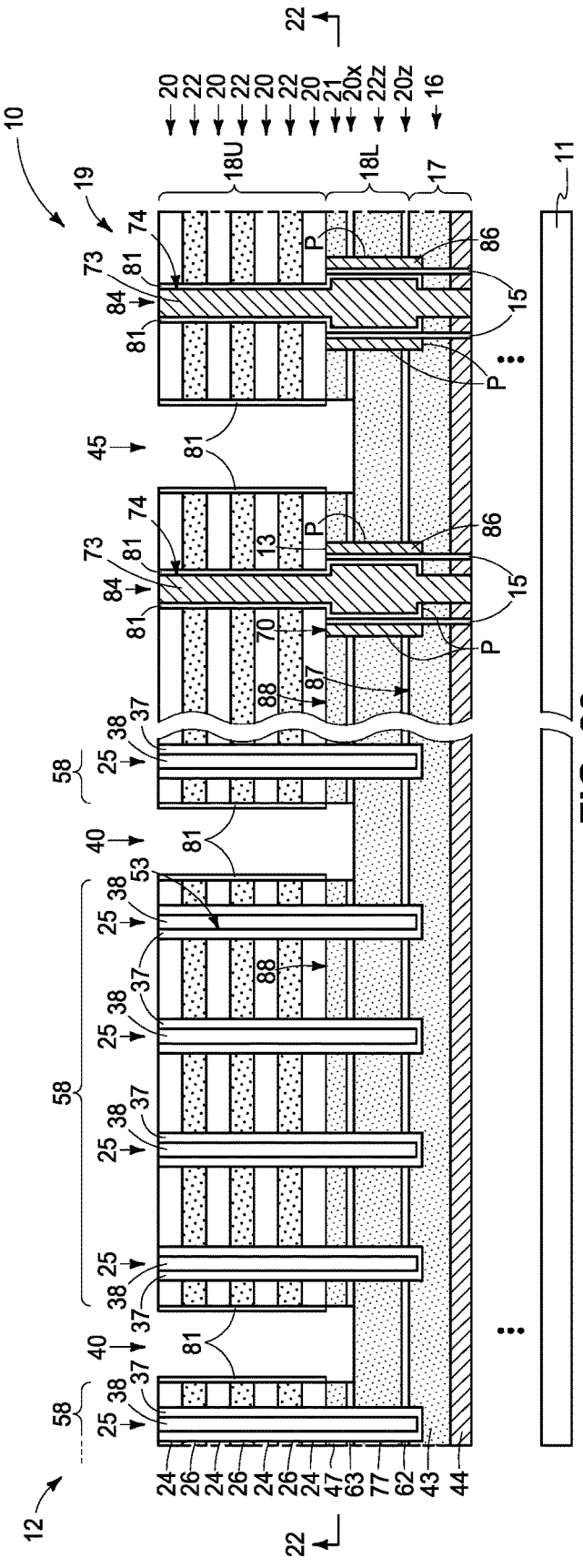

Referring to FIGS. 22 and 23, sacrificial rails 90 have been removed through trenches 40 and sacrificial bar 89 has been removed through trench 45. A liner 81 may be formed, and punched through, prior such removings. In one embodiment and as shown, sacrificial rails 90 and sacrificial bar 89 are removed after forming conductive material 73 of individual TAVs 74 and in one embodiment are removed at the same time.

Referring to FIGS. 24 and 25, and in one embodiment, an etching fluid (not shown) has been flowed into horizontally-elongated trenches 40 and 45 to isotropically etch sacrificial material 77 from lowest conductive tier 22z at least in array region 12 (sacrificial material 77 thereby not being shown). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. Liner 81 is ideally resistant to the etching fluid used during the flowing. FIGS. 24 and 25 show an embodiment wherein all sacrificial material 77 has also been removed in TAV region 19 (sacrificial material 77 thereby not being shown in TAV region 19). Alternately, none or only some of sacrificial material 77 may be removed from TAV region 19 (neither being shown). Whole, partial, or no removal of material 77 in TAV region may be dependent upon presence, size, number, and positioning of etch openings in TAV region 19 (e.g., trench opening(s) 45.).

Figure 28:
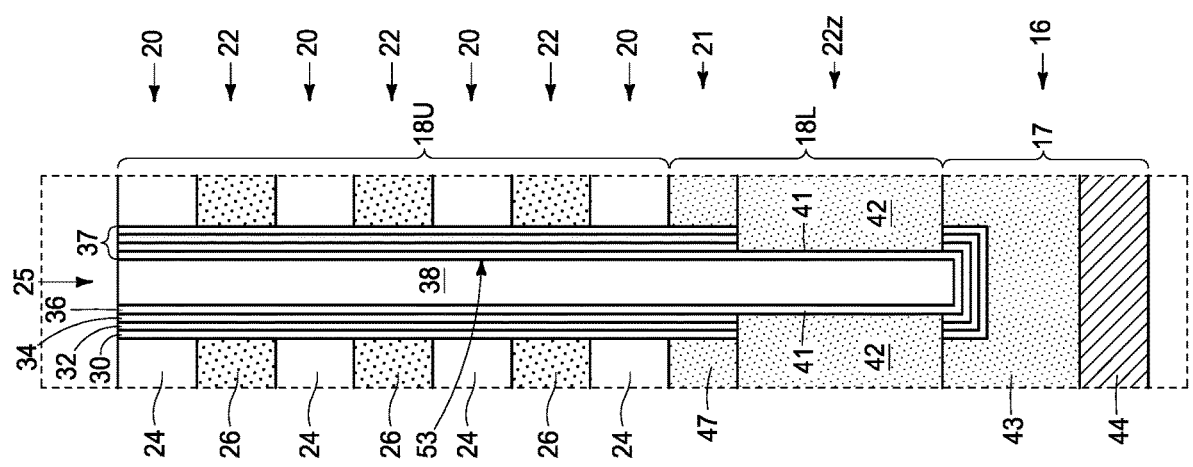
Figure 31:
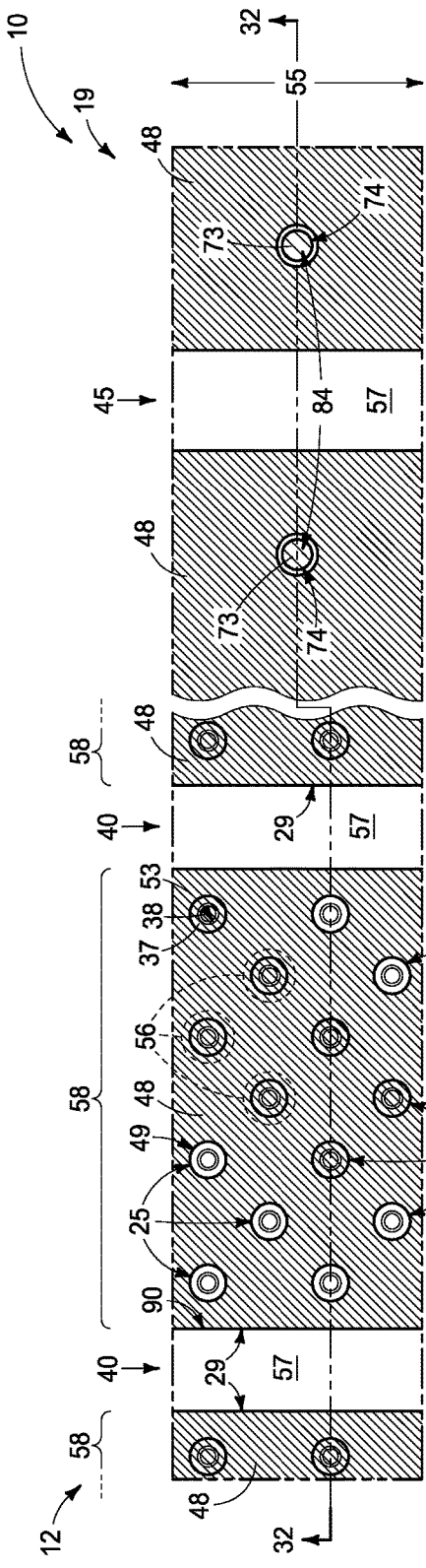
Figure 32:
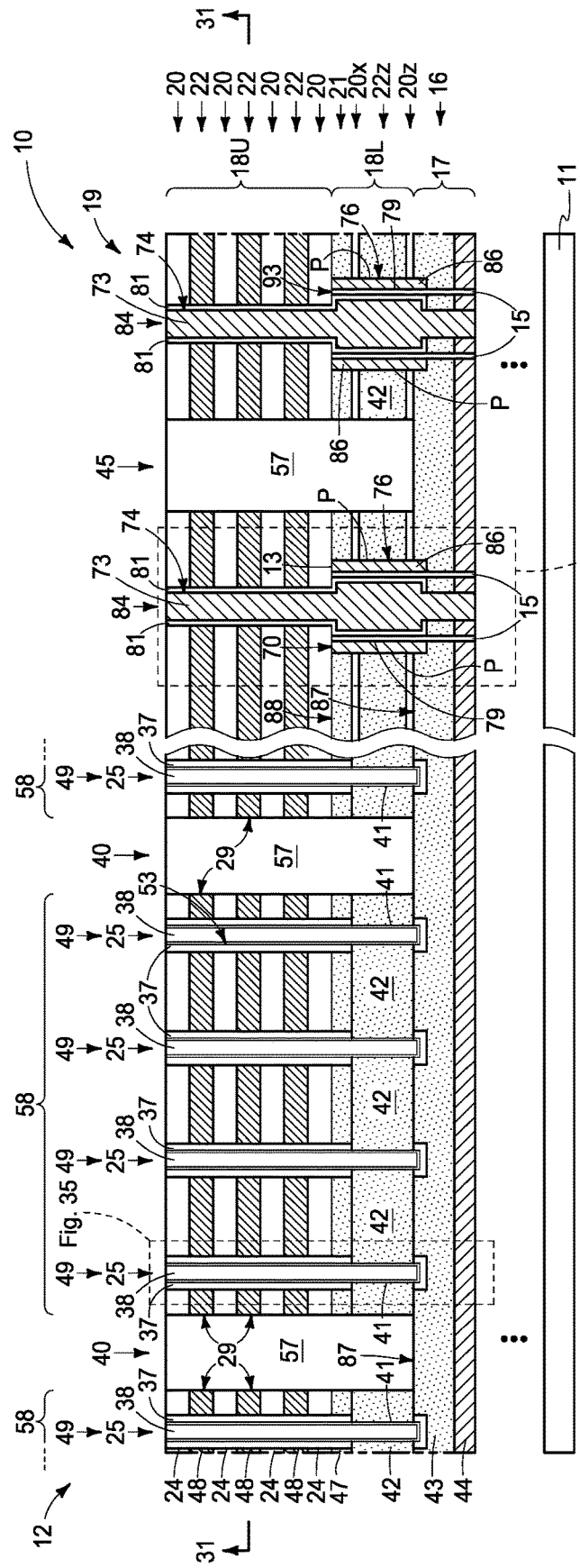
Figure 36:
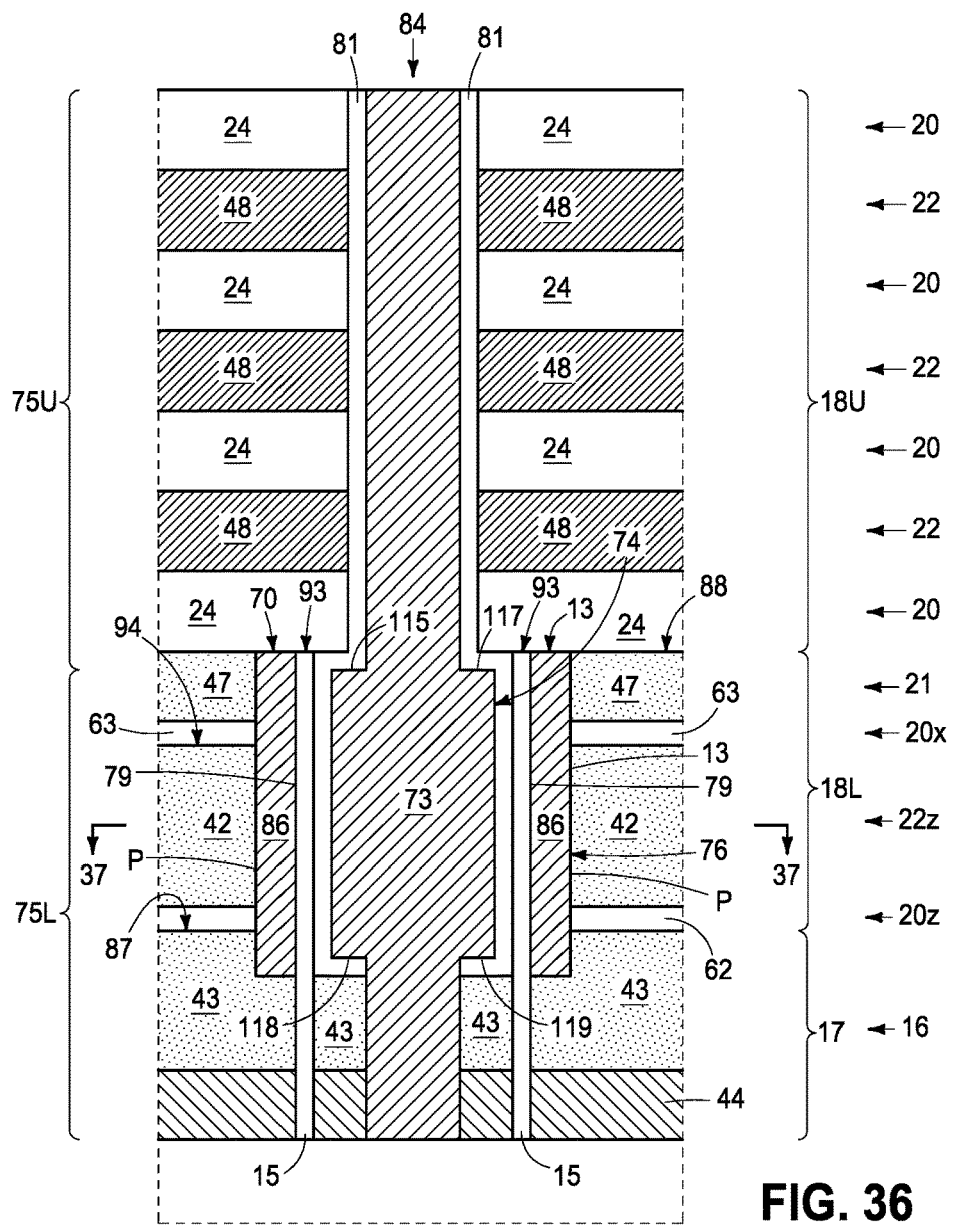
Figure 37:
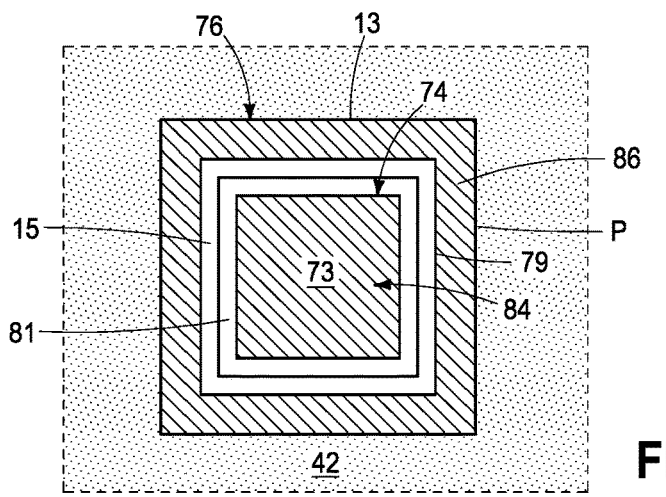

Referring to FIGS. 26-28, and in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. All or some of materials 62 and 63 may also be removed in TAV region 19.

After exposing sidewall 41, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Referring to FIGS. 29 and 30, conductive material 42 has been removed from trenches 40 as has sacrificial liner 81 (not there-shown). Sacrificial liner 81 (when present) may be removed before or after forming conductive material 42. Conductive material 42 and liner 81 have also been removed from trench 45 (when present, and in one such embodiment). In one embodiment as shown, conducting material 47 of tier 21 and conductive material 42 of tier 22z being directly against one another may collectively be considered as the lowest conductive tier at least in array region 12.

Referring to FIGS. 31-37, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (removal of all being shown) and replaced with conducting material 48, for example depending on proximity of trenches 40 that are closest thereto and/or presence or lack thereof of etch-blocking material(s)/structure(s) in tiers 22 in upper portion 18U (not shown) and presence of other openings (e.g., trench 45).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1 \times 10^{12}$ atoms/cm$^3$ of atoms of conductivity-increasing impurity in said material. In this document, "doped" is a material having more than $1 \times 10^{12}$ atoms/cm$^3$ of atoms of conductivity-increasing impurity therein and "conductively-doped" is material having at least $1 \times 10^{18}$ atoms/cm$^3$ of atoms of conductivity-increasing impurity therein. Intervening material 57 may include through array vias (not shown). In one embodiment and as shown, intervening material 57 has also been formed in trench 45 when present.

Any other attribute(s) or aspect(s) as shown and/or described herein with respect to other embodiments may be used.

An alternate example construction 10a and method is next described with respect to FIGS. 38-45. Like numerals from the above-described embodiments have been used where appropriate, with some construction differences being indicated with the suffix "a" or with different numerals. Referring to FIGS. 38 and 39, such show processing analogous to that shown by FIGS. 2 and 3 but wherein partially-sacrificial plugs 80a comprise horizontally-elongated lines 71 that individually extend across multiple horizontal locations 85 where individual TAVs will be formed. Individual horizontally-elongated lines 71 have laterally-outer sides 72.

Figure 40:
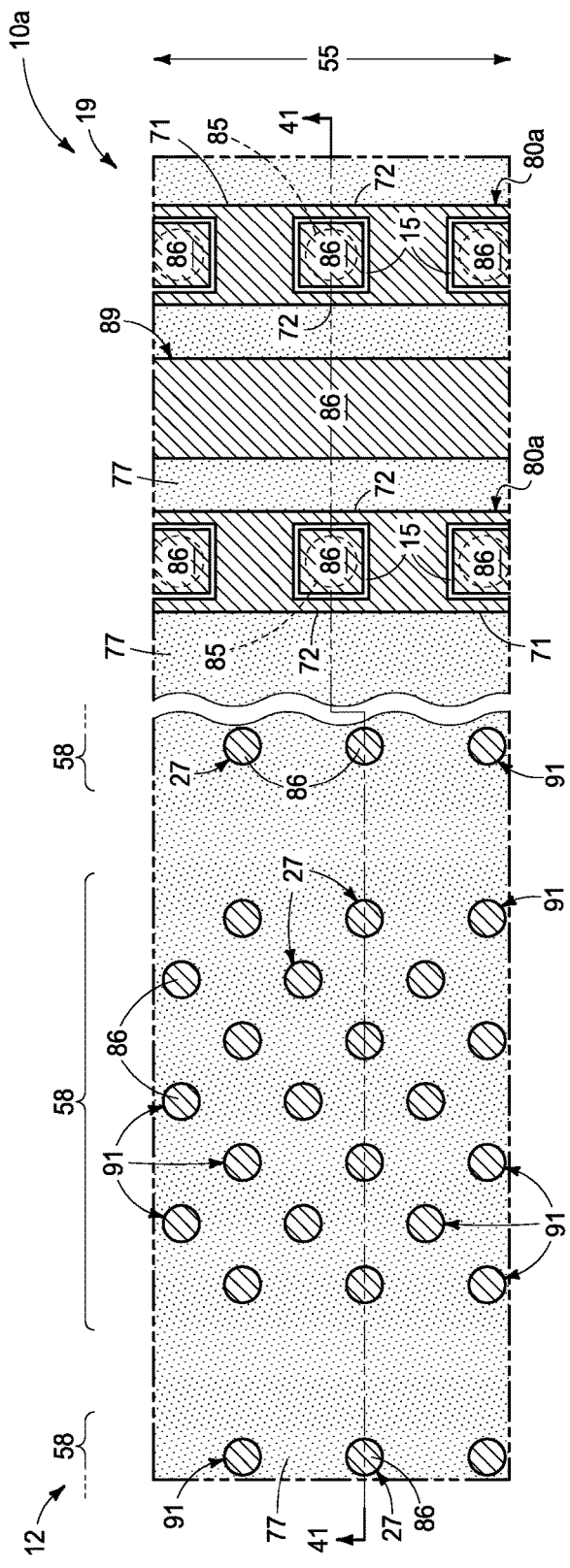
Figure 41:
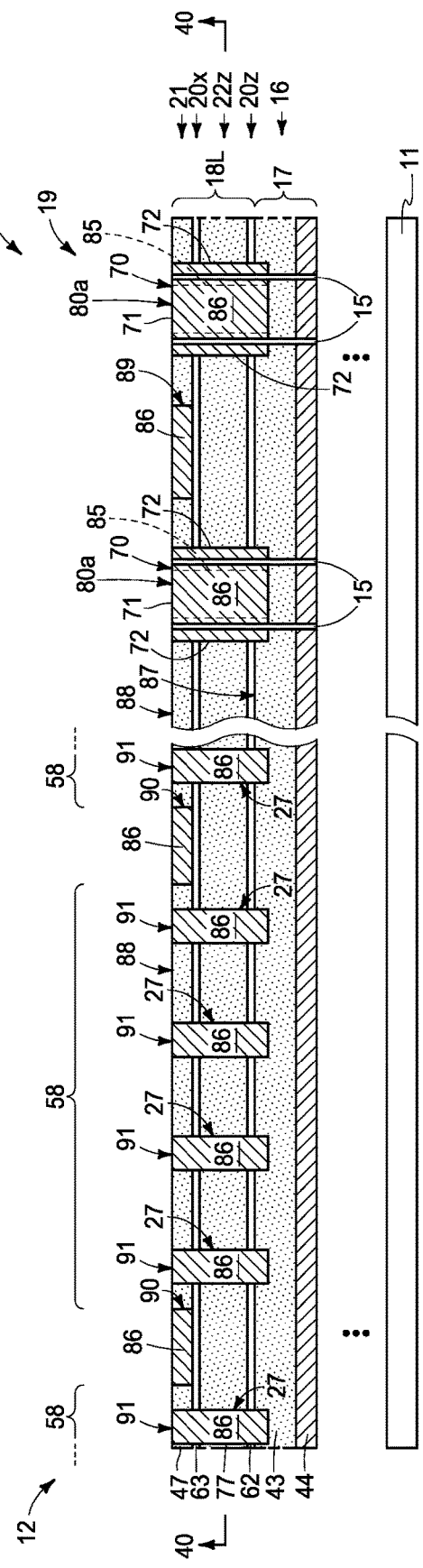
Figure 42:
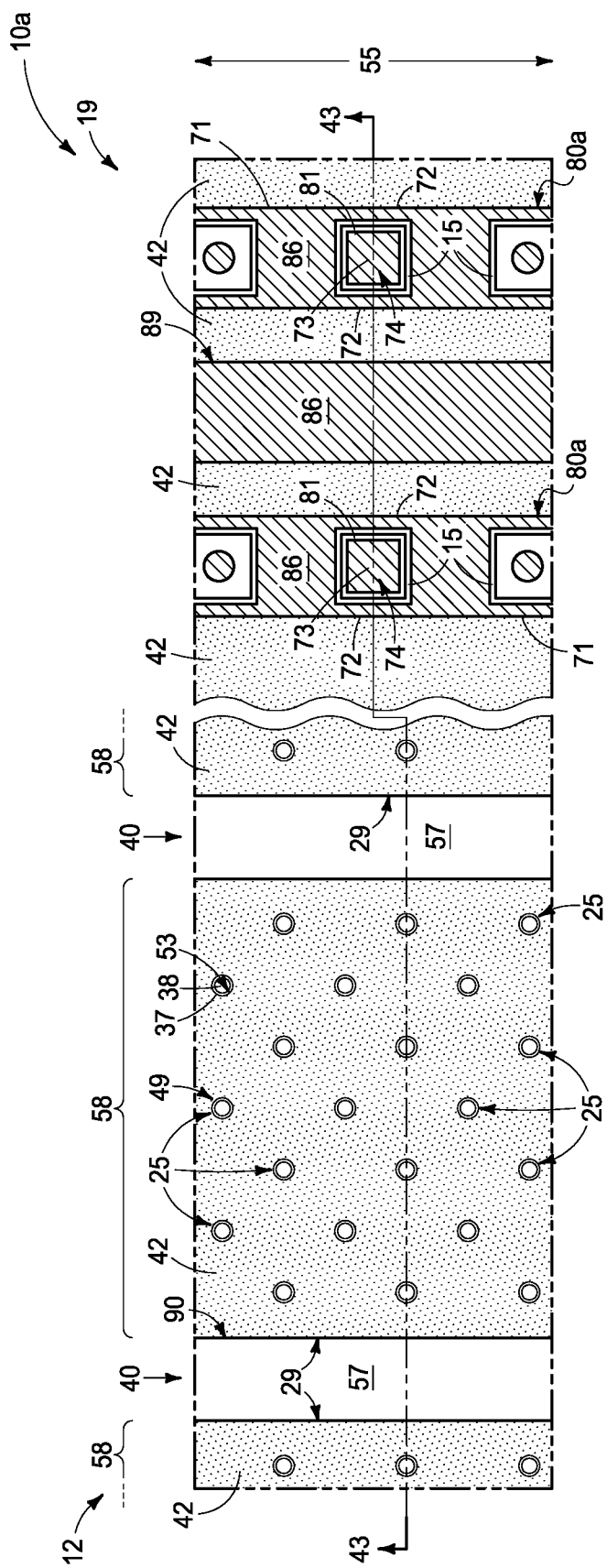
Figure 43:
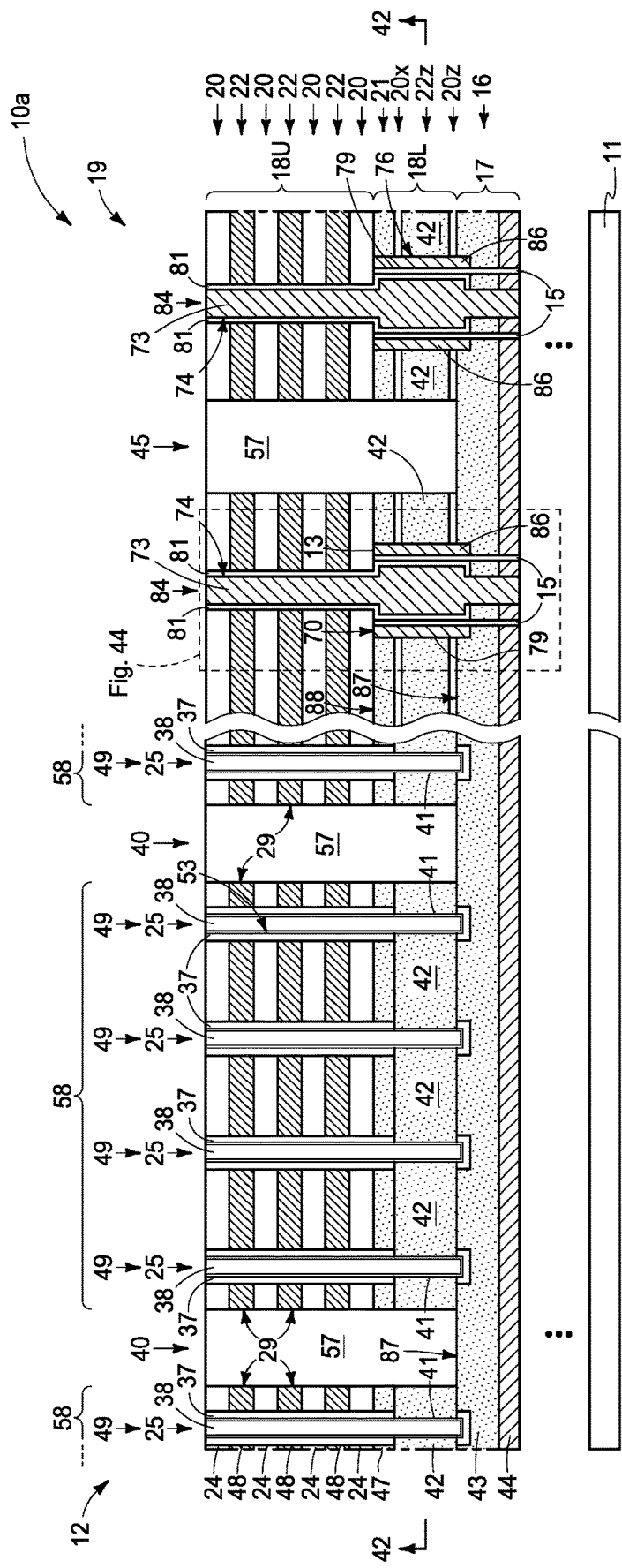
Figure 44:
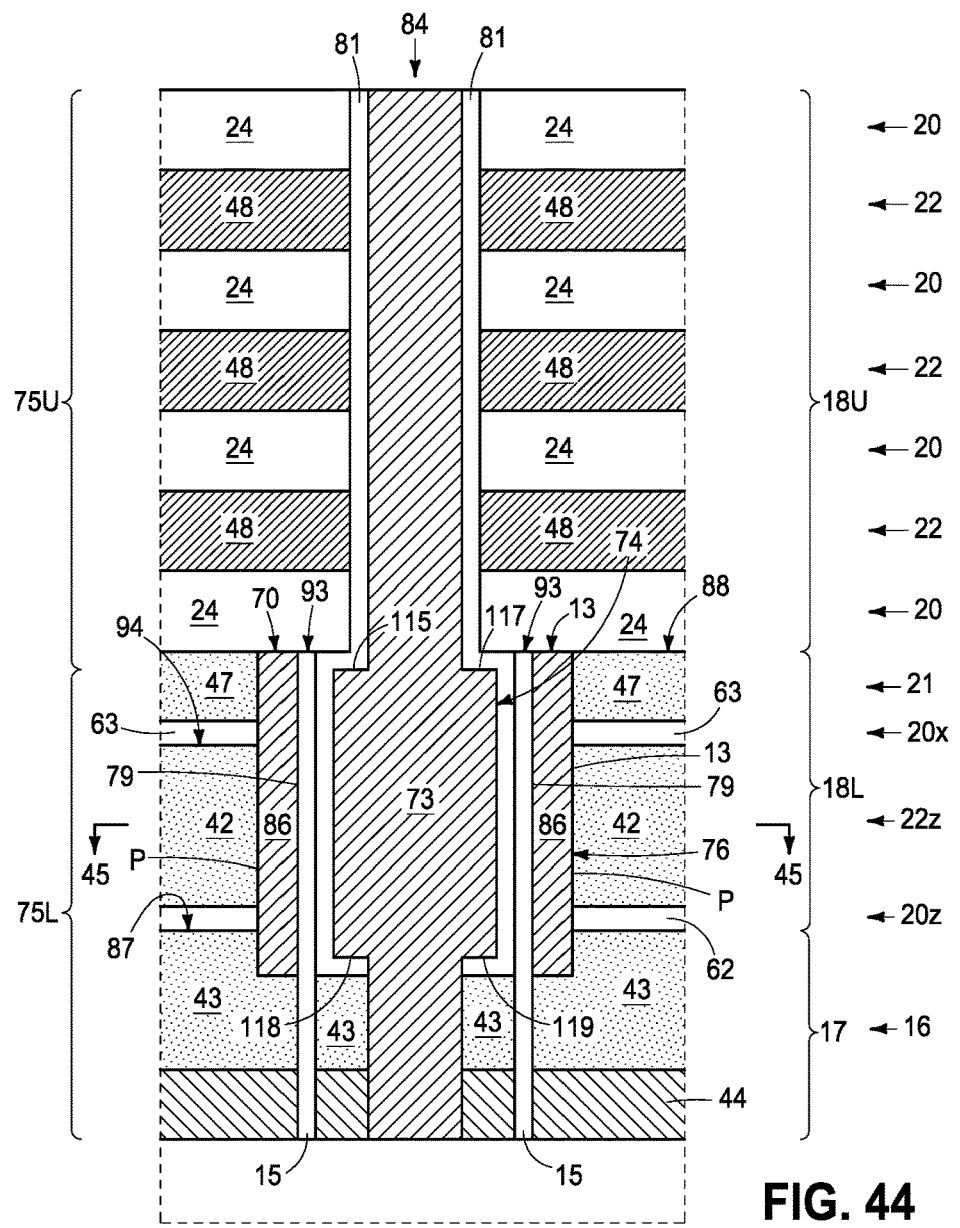
Figure 45:
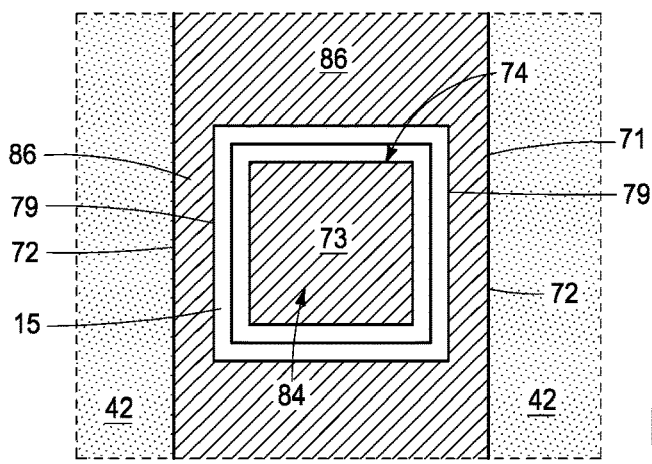

Referring to FIGS. 40 and 41, insulative rings 15 have been formed that individually extend through individual horizontally-elongated lines 71 around one of horizontal locations 85, analogous to the example processing shown by FIGS. 6 and 7. Individual insulative rings 15 are spaced laterally-inward from laterally-outer sides 72 of the horizontally-elongated line 71 through which they extend.

FIGS. 42-45 show analogous processing having occurred through and like that of FIGS. 31-37.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49)

of memory cells (e.g., 56) comprising channel-material strings (e.g., 53) extend through the insulative tiers and the conductive tiers. The channel-material strings directly electrically couple with conductor material (e.g., 17) of the conductor tier. A TAV region (e.g., 19) comprises TAVs (e.g., 74) that individually extend through the insulative tiers and the conductive tiers into the conductor tier. Individual of the TAVs comprise an upper portion (e.g., 75U in FIG. 44) directly above and joined with a lower portion (e.g., 75L). The individual TAVs in a vertical cross-section (e.g., that of FIG. 44) comprise at least one external upper jog surface (e.g., two external upper jog surfaces 115 and 117 being shown). The individual TAVs comprising at least one external lower jog surface in the conductor tier in the vertical cross-section and that is below the upper jog surface (e.g., two external lower jog surfaces 118 and 119 being shown). In this document, a "jog surface" is characterized or defined by an abrupt change in direction [at least 15°] in comparison to surfaces that are immediately-above and immediately-below the jog surface.

In one embodiment, the upper and lower jog surfaces individually include a part that is horizontal and in one such embodiment the part being exactly horizontal (e.g., the part(s) being all of the upper and lower jog surfaces and being exactly horizontal in the example embodiment). In one embodiment, conductive material of the TAVs (e.g., 74) is wider in the vertical cross-section immediately-below the upper jog surface than immediately-above the upper jog surface. In one embodiment, conductive material of the TAVs is wider in the vertical cross-section immediately-above the lower jog surface than immediately-below the lower jog surface.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A TAV region (e.g., 19) comprises TAVs (e.g., 74) that individually extend through a lowest of the conductive tiers (e.g., 22z). Insulative rings (e.g., 15) are in the lowest conductive tier in the TAV region and individually encircle individual of the TAVs. The insulative rings extend through the lowest conductive tier and into the conductor tier. Outer rings (e.g., 76 comprising material 86) are in the lowest conductive tier and individually encircle one of the individual insulative rings that encircle the individual TAVs. The example outer rings are square in horizontal cross-section although any polygonal or non-polygonal shape may be used (e.g., circular, elliptical, a combination of straight and curved sides, etc.). In one embodiment, the outer rings extend into the conductive tier. In one embodiment, the lowest conductive tier has a top in the TAV region (e.g., 94) and the outer rings individually have a top in the TAV region (e.g., 70) that is above the top of the lowest conductive tier in the TAV region.

In one embodiment, the outer rings are homogenous and in one embodiment are directly against the insulative rings. In one embodiment, the outer rings are conductive and in one such embodiment comprise conductive metal material.

In another embodiment, the outer rings are insulative, in one such embodiment are of the same composition as that of the insulative rings, and in one such latter embodiment are directly against the insulative rings (e.g., a perceptible interface 79 being there-between). In one embodiment, the outer rings are insulative and are of the different composition from that of the insulative rings. In one embodiment, the insulative rings have respective tops in the TAV region (e.g., 93), with the outer rings having respective tops in the TAV region that are elevationally-coincident with the tops of the insulative rings in the TAV region.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A TAV region (e.g., 19) comprises TAVs (e.g., 74) that individually extend through a lowest of the conductive tiers (e.g., 22z). Insulative rings (e.g., 15) are in the lowest conductive tier in the TAV region and individually encircle individual of the TAVs. The insulative rings extend through the lowest conductive tier and into the conductor tier. Horizontally-elongated lines (e.g., 71 comprising material 86) are in the lowest conductive tier in the TAV region, with individual of the horizontally-elongated lines extending between immediately-adjacent of the individual TAVs. Material (e.g., 86) of the horizontally-elongated lines (e.g., 71) encircles the individual insulative rings that encircle the immediately-adjacent individual TAVs between laterally-outer sides (e.g., 72) of the individual horizontally-elongated lines. The horizontally-elongated lines extend into the conductive tier.

In one embodiment, the horizontally-elongated lines are homogenous and in one embodiment are directly against the insulative rings. In one embodiment, the horizontally-elongated lines are conductive and in one such embodiment at least predominantly comprise conductive metal material. In another embodiment, the horizontally-elongated lines are insulative, in one such embodiment are of the same composition as that of the insulative rings, and in one such latter embodiment are directly against the insulative rings (e.g., a perceptible interface 79 being there-between). In one embodiment, the horizontally-elongated lines are insulative and are of the different composition from that of the insulative rings.

In one embodiment, the lowest conductive tier has a top in the TAV region (e.g., 94) and the horizontally-elongated lines individually having a top in the TAV region (e.g., 70) that is above the top of the lowest conductive tier in the TAV region. In one embodiment, the insulative rings have respective tops in the TAV region (e.g., 93), with the horizontally-elongated lines having respective tops in the TAV region that are elevationally-coincident with the tops of the insulative rings in the TAV region Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a lower portion of a stack that will comprise vertically-alternating first tiers and second tiers on a substrate. The stack comprises laterally-spaced memory-block regions and a through-array-via (TAV) region. The lower portion comprises a top. Partially-sacrificial plugs are formed in the lower portion of the stack in the TAV region that are individually in horizontal locations where individual TAVs will be formed. The partially-sacrificial plugs comprise islands that individually have a perimeter and have a top that is elevationally-coincident with the top of the lower portion. Insulative rings are formed that individually extend through individual of the islands. Individual of the insulative rings are spaced radially-inward from the perimeter of the island through which it extends. The vertically-alternating first tiers and second tiers of an upper portion of the stack are formed directly above the lower portion of the stack and the islands. TAV openings are formed into the upper portion of the stack that individually are at one of the horizontal locations and extend to sacrificial material of one of the islands that is radially-inward of the insulative ring extending there-through. Through the TAV openings, the sacrificial material of the individual islands is removed that is radially-inward of the insulative ring extending there-through to extend the TAV openings deeper into the stack. An individual TAV is formed in individual of the extended TAV openings and in void-space therein resulting from said removing. Channel-material strings are formed that extend through the first tiers and the second tiers in the memory block regions.

In some embodiments, a method used in forming a memory array comprising strings of memory cells comprises forming a lower portion of a stack that will comprise vertically-alternating first tiers and second tiers on a substrate. The stack comprises laterally-spaced memory-block regions and a through-array-via (TAV) region. The lower portion comprises a top. Partially-sacrificial plugs are formed in the lower portion of the stack in the TAV region. The partially-sacrificial plugs individually comprise horizontally-elongated lines that individually extend across multiple horizontal locations where individual TAVs will be formed. Individual of the horizontally-elongated lines have laterally-outer sides and have a top that is elevationally-coincident with the top of the lower portion. Insulative rings are formed that individually extend through the individual horizontally-elongated lines around one of the horizontal locations. Individual of the insulative rings are spaced laterally-inward from the laterally-outer sides of the horizontally-elongated line through which it extends. The vertically-alternating first tiers and second tiers of an upper portion of the stack are formed directly above the lower portion of the stack and the horizontally-elongated lines. TAV openings are formed into the upper portion of the stack that individually are at one of the horizontal locations and extend to sacrificial material of one of the horizontally-elongated lines that is radially-inward of the insulative ring extending there-through. Through the TAV openings, the sacrificial material of the individual horizontally-elongated lines is removed that is radially-inward of the insulative ring extending there-through to extend the TAV openings deeper into the stack. An individual TAV is formed in individual of the extended TAV openings and in void-space therein resulting from said removing. Channel-material strings are formed that extend through the first tiers and the second tiers in the memory block regions.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAVs that individually extend through the insulative tiers and the conductive tiers into the conductor tier. Individual of the TAVs comprises an upper portion directly above and joined with a lower portion. The individual TAVs in a vertical cross-section comprises at least one external upper jog surface. The individual TAVs comprise at least one external lower jog surface in the conductor tier in the vertical cross-section and that is below the upper jog surface.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAVs that individually extend through a lowest of the conductive tiers. Insulative rings are in the lowest conductive tier in the TAV region. Individual of the insulative rings encircle individual of the TAVs. The insulative rings extend through the lowest conductive tier and into the conductor tier. Outer rings are in the lowest conductive tier that individually encircle one of the individual insulative rings that encircle the individual TAVs. The outer rings extend into the conductor tier.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAVs that individually extend through a lowest of the conductive tiers. Insulative rings are in the lowest conductive tier in the TAV region. Individual of the insulative rings encircle individual of the TAVs. The insulative rings extend through the lowest conductive tier and into the conductor tier. Outer rings are in the lowest conductive tier that individually encircle one of the individual insulative rings that encircle the individual TAVs. The lowest conductive tier has a top in the TAV region. The outer rings individually have a top in the TAV region that is above the top of the lowest conductive tier in the TAV region.

In some embodiment, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAVs that individually extend through a lowest of the conductive tiers. Insulative rings are in the lowest conductive tier in the TAV region. Individual of the insulative rings encircle individual of the TAVs. The insulative rings extend through the lowest conductive tier and into the conductor tier. Horizontally-elongated lines are in the lowest conductive tier in the TAV region. Individual of the horizontally-elongated lines extend between immediately-adjacent of the individual TAVs. Material of the horizontally-elongated lines encircle the individual insulative rings that encircle the immediately-adjacent individual TAVs between laterally-outer sides of the individual horizontally-elongated lines. The horizontally-elongated lines extend into the conductor tier.

In some embodiment, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAVs that individually extend through a lowest of the conductive tiers. Insulative rings are in the lowest conductive tier in the TAV region. Individual of the insulative rings encircle individual of the TAVs. The insulative rings extend through the lowest conductive tier and into the conductor tier. Horizontally-elongated lines are in the lowest conductive tier in the TAV region. Individual of the horizontally-elongated lines extend between immediately-adjacent of the individual TAVs. Material of the horizontally-elongated lines encircle the individual insulative rings that encircle the immediately-adjacent individual TAVs between laterally-outer sides of the individual horizontally-elongated lines. The lowest conductive tier has a top in the TAV region. The horizontally-elongated lines individually have a top in the TAV region that is above the top of the lowest conductive tier in the TAV region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a lower portion of a stack that will comprise vertically-alternating first tiers and second tiers on a substrate, the stack comprising laterally-spaced memory-block regions and a through-array-via (TAV) region, the lower portion comprising a top;
    forming partially-sacrificial plugs in the lower portion of the stack in the TAV region that are individually in horizontal locations where individual TAVs will be formed, the partially-sacrificial plugs comprising islands individually having a perimeter and having a top is that elevationally-coincident with the top of the lower portion;
    forming insulative rings that individually extend through individual of the islands, individual of the insulative rings being spaced radially-inward from the perimeter of the island through which it extends;
    forming the vertically-alternating first tiers and second tiers of an upper portion of the stack directly above the lower portion of the stack and the islands;
    forming TAV openings into the upper portion of the stack that individually are at one of the horizontal locations and extend to sacrificial material of one of the islands that is radially-inward of the insulative ring extending there-through;
    through the TAV openings, removing the sacrificial material of the individual islands that is radially-inward of the insulative ring extending there-through to extend the TAV openings deeper into the stack;
    forming an individual TAV in individual of the extended TAV openings and in void-space therein resulting from said removing; and
    forming channel-material strings that extend through the first tiers and the second tiers in the memory block regions.

2. The method of claim 1 wherein the sacrificial material comprises conductive metal material.

3. The method of claim 1 wherein the sacrificial material comprises insulative material.

4. The method of claim 1 wherein the sacrificial material comprises semiconductive material.

5. The method of claim 1 wherein the islands as initially formed are homogenous.

6. The method of claim 5 wherein the sacrificial material comprises conductive metal material.

7. The method of claim 1 comprising:
    forming sacrifice plugs in the lower portion while forming the islands, the sacrifice plugs individually being in horizontal locations where the channel-material strings will be formed;
    forming channel openings into the upper portion to the sacrifice plugs and removing the sacrifice plugs through the channel openings; and
    forming the channel-material stings in the channel openings after the removing of the sacrifice plugs.

8. The method of claim 1 comprising:
    forming sacrificial rails in the lower portion, the sacrificial rails individually being between immediately-laterally-adjacent of the memory-block regions; and forming trenches into the upper portion to the sacrificial rails and removing the sacrificial rails through the trenches.

9. The method of claim 1 comprising:
forming a sacrificial bar in the lower portion in the TAV region; and
forming a trench into the upper portion to the sacrificial bar and removing the sacrificial bar through the trench.

10. The method of claim 1 comprising:
forming sacrificial rails and a sacrificial bar in the lower portion at the same time, the sacrificial rails individually being between immediately-laterally-adjacent of the memory-block regions, the sacrificial bar being in the TAV region;
forming trenches in the upper portion that individually extend to individual of the sacrificial rails or the sacrificial bar; and
removing the sacrificial rails and the sacrificial bar through the trenches.

11. The method of claim 10 wherein the sacrificial rails and the sacrificial bar are removed after forming conductive material of the individual TAVs.

12. The method of claim 11 wherein the sacrificial rails and the sacrificial bar are removed at the same time.

13. A method used in forming a memory array comprising strings of memory cells, comprising:
forming a lower portion of a stack that will comprise vertically-alternating first tiers and second tiers on a substrate, the stack comprising laterally-spaced memory-block regions and a through-array-via (TAV) region, the lower portion comprising a top;
forming partially-sacrificial plugs in the lower portion of the stack in the TAV region, the partially-sacrificial plugs individually comprising horizontally-elongated lines that individually extend across multiple horizontal locations where individual TAVs will be formed, individual of the horizontally-elongated lines having laterally-outer sides and having a top that is elevationally-coincident with the top of the lower portion;
forming insulative rings that individually extend through the individual horizontally-elongated lines around one of the horizontal locations, individual of the insulative rings being spaced laterally-inward from the laterally-outer sides of the horizontally-elongated line through which it extends;
forming the vertically-alternating first tiers and second tiers of an upper portion of the stack directly above the lower portion of the stack and the horizontally-elongated lines;
forming TAV openings into the upper portion of the stack that individually are at one of the horizontal locations and extend to sacrificial material of one of the horizontally-elongated lines that is radially-inward of the insulative ring extending there-through;
through the TAV openings, removing the sacrificial material of the individual horizontally-elongated lines that is radially-inward of the insulative ring extending there-through to extend the TAV openings deeper into the stack;
forming an individual TAV in individual of the extended TAV openings and in void-space therein resulting from said removing; and
forming channel-material strings that extend through the first tiers and the second tiers in the memory block regions.

14. The method of claim 13 wherein the sacrificial material comprises conductive metal material.

15. The method of claim 13 wherein the sacrificial material comprises insulative material.

16. The method of claim 13 wherein the sacrificial material comprises semiconductive material.

17. The method of claim 13 wherein the islands as initially formed are homogenous.

18. The method of claim 17 wherein the sacrificial material comprises conductive metal material.

19. The method of claim 13 comprising:
forming sacrifice plugs in the lower portion while forming the islands, the sacrifice plugs individually being in horizontal locations where the channel-material strings will be formed;
forming channel openings into the upper portion to the sacrifice plugs and removing the sacrifice plugs through the channel openings; and
forming the channel-material stings in the channel openings after the removing of the sacrifice plugs.

20. The method of claim 13 comprising:
forming sacrificial rails in the lower portion, the sacrificial rails individually being between immediately-laterally-adjacent of the memory-block regions; and
forming trenches into the upper portion to the sacrificial rails and removing the sacrificial rails through the trenches.

21. The method of claim 13 comprising:
forming a sacrificial bar in the lower portion in the TAV region; and
forming a trench into the upper portion to the sacrificial bar and removing the sacrificial bar through the trench.

22. The method of claim 13 comprising:
forming sacrificial rails and a sacrificial bar in the lower portion at the same time, the sacrificial rails individually being between immediately-laterally-adjacent of the memory-block regions, the sacrificial bar being in the TAV region;
forming trenches in the upper portion that individually extend to individual of the sacrificial rails or the sacrificial bar; and
removing the sacrificial rails and the sacrificial bar through the trenches.

23. The method of claim 22 wherein the sacrificial rails and the sacrificial bar are removed after forming conductive material of the individual TAVs.

24. The method of claim 23 wherein the sacrificial rails and the sacrificial bar are removed at the same time.

25. A memory array comprising strings of memory cells, comprising:
laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling with conductor material of the conductor tier; and
a through-array-via (TAV) region comprising TAVs that individually extend through the insulative tiers and the conductive tiers into the conductor tier, individual of the TAVs comprising an upper portion directly above and joined with a lower portion, the individual TAVs in a vertical cross-section comprising at least one external upper jog surface, the individual TAVs comprising at least one external lower jog surface in the conductor tier in the vertical cross-section and that is below the upper jog surface.

26. A memory array comprising strings of memory cells, comprising:
- laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier;
- a through-array-via (TAV) region comprising TAVs that individually extend through a lowest of the conductive tiers;
- insulative rings in the lowest conductive tier in the TAV region, individual of the insulative rings encircling individual of the TAVs, the insulative rings extending through the lowest conductive tier and into the conductor tier; and
- outer rings in the lowest conductive tier that individually encircle one of the individual insulative rings that encircle the individual TAVs, the outer rings extending into the conductor tier.

27. A memory array comprising strings of memory cells, comprising:
- laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier;
- a through-array-via (TAV) region comprising TAVs that individually extend through a lowest of the conductive tiers;
- insulative rings in the lowest conductive tier in the TAV region, individual of the insulative rings encircling individual of the TAVs, the insulative rings extending through the lowest conductive tier and into the conductor tier; and
- outer rings in the lowest conductive tier that individually encircle one of the individual insulative rings that encircle the individual TAVs, the lowest conductive tier having a top in the TAV region, the outer rings individually having a top in the TAV region that is above the top of the lowest conductive tier in the TAV region.

28. A memory array comprising strings of memory cells, comprising:
- laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier;
- a through-array-via (TAV) region comprising TAVs that individually extend through a lowest of the conductive tiers;
- insulative rings in the lowest conductive tier in the TAV region, individual of the insulative rings encircling individual of the TAVs, the insulative rings extending through the lowest conductive tier and into the conductor tier; and
- horizontally-elongated lines in the lowest conductive tier in the TAV region, individual of the horizontally-elongated lines extending between immediately-adjacent of the individual TAVS, material of the horizontally-elongated lines encircling the individual insulative rings that encircle the immediately-adjacent individual TAVs between laterally-outer sides of the individual horizontally-elongated lines, the horizontally-elongated lines extending into the conductor tier.

29. A memory array comprising strings of memory cells, comprising:
- laterally-spaced memory blocks individually comprising a vertical stack comprising alternating insulative tiers and conductive tiers directly above a conductor tier, strings of memory cells comprising channel-material strings that extend through the insulative tiers and the conductive tiers, the channel-material strings directly electrically coupling to conductor material of the conductor tier;
- a through-array-via (TAV) region comprising TAVs that individually extend through a lowest of the conductive tiers;
- insulative rings in the lowest conductive tier in the TAV region, individual of the insulative rings encircling individual of the TAVs, the insulative rings extending through the lowest conductive tier and into the conductor tier; and
- horizontally-elongated lines in the lowest conductive tier in the TAV region, individual of the horizontally-elongated lines extending between immediately-adjacent of the individual TAVs, material of the horizontally-elongated lines encircling the individual insulative rings that encircle the immediately-adjacent individual TAVs between laterally-outer sides of the individual horizontally-elongated lines, the lowest conductive tier having a top in the TAV region, the horizontally-elongated lines individually having a top in the TAV region that is above the top of the lowest conductive tier in the TAV region.

30. The memory array of claim 25 wherein the upper and lower jog surfaces individually include a part that is horizontal.

31. The memory array of claim 30 wherein the part is exactly horizontal.

32. The memory array of claim 25 wherein conductive material of the TAVs is wider in the vertical cross-section immediately-below the upper jog surface than immediately-above the upper jog surface.

33. The memory array of claim 25 wherein conductive material of the TAVs is wider in the vertical cross-section immediately-above the lower jog surface than immediately-below the lower jog surface.

34. The memory array of claim 25 wherein,
- conductive material of the TAVs is wider in the vertical cross-section immediately-below the upper jog surface than immediately-above the upper jog surface; and
- the conductive material of the TAVs is wider in the vertical cross-section immediately-above the lower jog surface than immediately-below the lower jog surface.

35. The memory array of claim 26 wherein the outer rings are homogenous.

36. The memory array of claim 26 wherein the outer rings are directly against the insulative rings.

37. The memory array of claim 26 wherein the outer rings are conductive.

38. The memory array of claim 37 wherein the outer rings at least predominantly comprise conductive metal material.

39. The memory array of claim 38 wherein the outer rings are directly against the insulative rings.

40. The memory array of claim 26 wherein the outer rings are insulative.

41. The memory array of claim 40 wherein the outer rings are of the same composition as that of the insulative rings.

42. The memory array of claim 41 wherein the outer rings are directly against the insulative rings.

43. The memory array of claim 40 wherein the outer rings are of different composition from that of the insulative rings.

44. The memory array of claim 26 wherein the lowest conductive tier has a top in the TAV region, the outer rings individually having a top in the TAV region that is above the top of the lowest conductive tier in the TAV region.

45. The memory array of claim 26 wherein the insulative rings have respective tops in the TAV region, the outer rings having respective tops in the TAV region that are elevationally-coincident with the tops of the insulative rings in the TAV region.

46. The memory array of claim 26 wherein the individual TAVs in a vertical cross-section comprise at least one external upper jog surface, the individual TAVs comprising at least one external lower jog surface in the conductor tier in the vertical cross-section and that is below the upper jog surface.

47. The memory array of claim 27 wherein the individual TAVs in a vertical cross-section comprise at least one external upper jog surface, the individual TAVs comprising at least one external lower jog surface in the conductor tier in the vertical cross-section and that is below the upper jog surface.

48. The memory array of claim 28 wherein the horizontally-elongated lines are homogenous.

49. The memory array of claim 28 wherein the horizontally-elongated lines are directly against the insulative rings.

50. The memory array of claim 28 wherein the horizontally-elongated lines are conductive.

51. The memory array of claim 50 wherein the material of the horizontally-elongated lines at least predominantly comprises conductive metal material.

52. The memory array of claim 51 wherein the horizontally-elongated lines are directly against the insulative rings.

53. The memory array of claim 28 wherein the horizontally-elongated lines are insulative.

54. The memory array of claim 53 wherein the material of the horizontally-elongated lines are of the same composition as that of the insulative rings.

55. The memory array of claim 54 wherein the horizontally-elongated lines are directly against the insulative rings.

56. The memory array of claim 53 wherein the material of the horizontally-elongated lines is of different composition from that of the insulative rings.

57. The memory array of claim 28 wherein the lowest conductive tier has a top in the TAV region, the horizontally-elongated lines individually having a top in the TAV region that is above the top of the lowest conductive tier in the TAV region.

58. The memory array of claim 28 wherein the insulative rings have respective tops in the TAV region, the horizontally-elongated lines having respective tops in the TAV region that are elevationally-coincident with the tops of the insulative rings in the TAV region.

59. The memory array of claim 28 wherein the individual TAVs in a vertical cross-section comprise at least one external upper jog surface, the individual TAVs comprising at least one external lower jog surface in the conductor tier in the vertical cross-section and that is below the upper jog surface.

60. The memory array of claim 29 wherein the individual TAVs in a vertical cross-section comprise at least one external upper jog surface, the individual TAVs comprising at least one external lower jog surface in the conductor tier in the vertical cross-section and that is below the upper jog surface.

\* \* \* \* \*